(12) United States Patent
Xu et al.

(10) Patent No.: US 10,494,713 B2
(45) Date of Patent: *Dec. 3, 2019

(54) METHOD OF FORMING AN OPTICALLY-FINISHED THIN DIAMOND FILM, DIAMOND SUBSTRATE, OR DIAMOND WINDOW OF HIGH ASPECT RATIO

(71) Applicant: II-VI Incorporated, Saxonburg, PA (US)

(72) Inventors: Wen-Qing Xu, Medfield, MA (US); Thomas E. Anderson, Convent Station, NJ (US); Giovanni Barbarossa, Saratoga, CA (US); Elgin E. Eissler, Renfrew, PA (US); Chao Liu, Butler, PA (US); Charles D. Tanner, Saxonburg, PA (US)

(73) Assignee: II-VI Incorporated, Saxonburg, PA (US)

( * ) Notice: Subject to any disclaimer, the term of this patent is extended or adjusted under 35 U.S.C. 154(b) by 55 days.

This patent is subject to a terminal disclaimer.

(21) Appl. No.: 15/093,160

(22) Filed: Apr. 7, 2016

(65) Prior Publication Data
US 2016/0333472 A1 Nov. 17, 2016

Related U.S. Application Data

(60) Provisional application No. 62/148,339, filed on Apr. 16, 2015.

(51) Int. Cl.
C23C 16/27 (2006.01)
C23C 16/56 (2006.01)
(Continued)

(52) U.S. Cl.
CPC ............ *C23C 16/274* (2013.01); *C23C 16/01* (2013.01); *C23C 16/511* (2013.01); *C23C 16/56* (2013.01)

(58) Field of Classification Search
CPC ........ C23C 16/26; C23C 16/27; C23C 16/274
See application file for complete search history.

(56) References Cited

U.S. PATENT DOCUMENTS 5,146,481 A * 9/1992 Garg ..................... C23C 16/271
378/35
5,318,836 A * 6/1994 Ito .......................... B23P 15/28
428/323

(Continued)

OTHER PUBLICATIONS

Takahashi, H., et al., "Fracture toughness of the interface between CVD diamond film and silicon substrate in the relation with methane concentration in the source gas mixture". Diamond and Related Materials 10 (2001) 760-764.*

(Continued)

*Primary Examiner* — Bret P Chen
(74) *Attorney, Agent, or Firm* — The Webb Law Firm

(57) ABSTRACT

In a method of forming a diamond film, diamond substrate, or diamond window, a silicon substrate is provided and the diamond film, diamond substrate, or diamond window is CVD grown on a surface of the silicon substrate. The grown diamond film, diamond substrate, or diamond window has an aspect ratio ≥100, wherein the aspect ratio is a ratio of a largest dimension of the diamond film, diamond substrate, or diamond window divided by a thickness of the diamond film, diamond substrate, or diamond window. The silicon substrate has a thickness greater than or equal to 2 mm. The silicon substrate can optionally be removed or separated from the grown diamond film, diamond substrate, or diamond window.

26 Claims, 13 Drawing Sheets

(51) Int. Cl.
*C23C 16/511* (2006.01)
*C23C 16/01* (2006.01)

(56) References Cited

U.S. PATENT DOCUMENTS

| | | | | |
|---|---|---|---|---|
| 5,643,639 A * | 7/1997 | Rudder | ............... | C23C 16/272 216/68 |
| 5,736,226 A | 4/1998 | Tanabe et al. | | |
| 5,869,133 A * | 2/1999 | Anthony | ............... | C23C 16/01 216/10 |
| 6,110,759 A | 8/2000 | Konrad et al. | | |
| 7,241,206 B1 * | 7/2007 | Sung | ............... | B24B 7/228 451/527 |
| 2003/0137217 A1 * | 7/2003 | Ishibashi | ............ | H03H 9/02582 310/313 R |
| 2004/0031438 A1 | 2/2004 | Sung | | |
| 2004/0175875 A1 * | 9/2004 | Sung | ............... | H01L 23/373 438/197 |
| 2006/0213428 A1 | 9/2006 | Meguro et al. | | |
| 2007/0104399 A1 | 5/2007 | Hamza et al. | | |
| 2009/0242016 A1 * | 10/2009 | Zach | ............... | B23B 27/148 136/252 |
| 2010/0034984 A1 * | 2/2010 | Asmussen | ............ | C23C 16/274 427/575 |
| 2010/0068503 A1 * | 3/2010 | Neogi | ............... | C04B 41/009 428/323 |
| 2010/0189924 A1 * | 7/2010 | D'Evelyn | ............ | C23C 16/274 427/575 |
| 2010/0320082 A1 * | 12/2010 | Kato | ............... | C25B 1/13 204/266 |
| 2012/0199884 A1 * | 8/2012 | Shintani | ............ | G01N 27/414 257/253 |
| 2014/0220261 A1 * | 8/2014 | Asmussen | ............ | C23C 16/511 427/570 |
| 2015/0075420 A1 * | 3/2015 | Noguchi | ............ | C30B 25/105 117/86 |
| 2015/0110987 A1 * | 4/2015 | Liggins | ............ | C23C 16/274 428/64.1 |
| 2016/0177441 A1 * | 6/2016 | Sabens | ............ | C23C 16/4583 427/575 |
| 2016/0186362 A1 * | 6/2016 | Mollart | ............ | H01L 21/02376 257/618 |
| 2017/0260625 A1 * | 9/2017 | Xu | ............... | C23C 16/01 |

OTHER PUBLICATIONS

Samudrala, Gopi K., et al., "Rapid Growth of Nanostructured Diamond Film on Silicon and Ti-6Al-4V Alloy Substrates" Materials 2014, 7, 365-374.*
Baek, S.S. et al., "The microstructure of CVD diamond for high-density thermal inkjet". Microsystem Technologies 11 (2005) 386-395.*
Kulkarni, A.K., et al., "Electrical characterization of CVD diamond thin films grown on silicon substrates". Thin Solid Films 270 (1995) 189-193.*
Zuo, S.S., et al., "Investigation of diamond deposition uniformity and quality for freestanding film and substrate applications". Diamond and Related Materials 17 (2008) 300-305.*
Mortet, V., et al., "Surface acoustic wave propagation in aluminum nitride-unpolished freestanding diamond structures". Applied Physics Letters, vol. 81, No. 9, Aug. 26, 2002, pp. 1720-1722.*
Flannery, Colm M., et al., "Surface acoustic wave properties of freestanding diamond films". IEEE Transactions on Ultrasonics, Ferroelectrics, and Frequency Control, vol. 51, No. 3, Mar. 2004, pp. 368-371.*
Ito, Shinya, et al., "Self-separation of freestanding diamond films using graphite interlayers precipated from C-dissolved Ni substrates". Journal of Crystal Growth, 470 (2017) 104-107.*
Nazare et al., "Properties, Growth and Applications of Diamond," 2001, 446 total book pages, Inspec, London, UK.
Asmussen et al.., (Editors), "Diamond Films Handbook," 2002, 688 total book pages, Marcel Dekker, Inc., NY, NY, US.
Kobashi, "Diamond Films Chemical Vapor Deposition for Oriented and Heteroepitaxial Growth," 2005, 348 total book pages, Elsevier Ltd., Oxford, UK.
Zaitsev, "Optical Properties of Diamond a Data Handbook," 2001, 508 total book pages, Springer-Verlag Berlin Heidelberg, NY, NY, US.

* cited by examiner

- GROWTH SIDE RAMAN DIAMOND PEAK FWHM=2.8cm$^{-1}$, PEAK POSITION AROUND 1331.9-1332.1cm$^{-1}$ → VERY HIGH QUALITY, NO STRESS DIAMOND

- NUCLEATION SIDE RAMAN DIAMOND PEAK FWHM=3.8-4.1cm$^{-1}$, PEAK POSITION AT 1331.6cm$^{-1}$ → GOOD QUALITY, LOW STRESS DIAMOND, TYPICAL FOR NUCLEATION LAYER.

DIAMOND DOME

DIAMOND CONE

DIAMOND PYRAMID

DIAMOND ASPHERIC

FIG. 5E
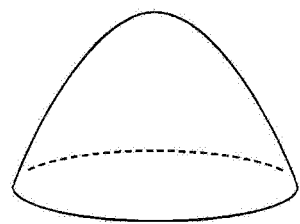
DIAMOND PARABOLIC
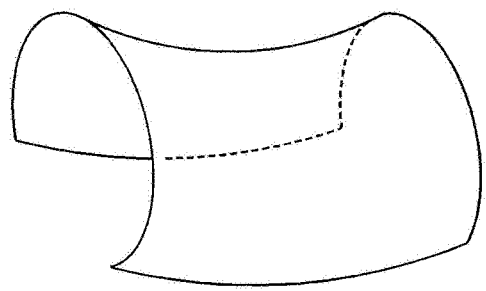
FIG. 5F
DIAMOND HYPERBOLIC (a): DIAMOND WINDOW, 99 μm THICK, TRADITIONAL SEEDING (0.25 μm DIAMOND SLURRY), GROWTH SIDE POLISHED (EXAMPLE 8).

(b): DIAMOND WINDOW, 197 μm THICK, 2-STEP SEEDING (0.25 μm DIAMOND SLURRY + NANO-DIAMOND), GROWTH SIDE POLISHED (EXAMPLE 9).

(c): DIAMOND WINDOW, 140 μm THICK, NANO-DIAMOND SEEDING, GROWTH SIDE POLISHED (EXAMPLE 10).

NOTE: THE SAMPLE-STOPPER DISTANCE IS A LOCATION WHERE THE TRANSMITTED LIGHT IS BLOCKED.

METHOD OF FORMING AN OPTICALLY-FINISHED THIN DIAMOND FILM, DIAMOND SUBSTRATE, OR DIAMOND WINDOW OF HIGH ASPECT RATIO

CROSS REFERENCE TO RELATED APPLICATION

This application claims priority to U.S. Provisional Application No. 62/148,339, filed Apr. 16, 2015, the contents of which are incorporated herein by reference.

BACKGROUND OF THE INVENTION

Field of the Invention

The present application relates to a thin diamond film, substrate, or window that has at least one optically-finished surface. The diamond film, substrate, or window has a large aspect ratio, defined as a largest dimension over thickness. The present invention also relates to a process of producing the diamond film, substrate, or window.

Description of Related Art

Diamond is the hardest material known, having a Mohs Hardness of 10, which makes diamond useful for applications such as cutting, machining, drilling, milling, etc. Diamond is also the most thermally conductive material known, having a thermal conductivity up to 2000 to 2200 watts per meter per Kelvin, which makes it desirable for applications in thermal management under demanding conditions. Diamond also has a low coefficient of friction, which makes it a versatile material for uses such as brakes. With diamond on diamond, it is the low wear coefficient and lubricating uses under extreme conditions which makes it advantageous. Diamond is also an excellent optical material for transmitting microwave, infrared, visible, and other ultraviolet electromagnetic waves. Diamond is also highly stable when used as detector for high fluence nuclear radiation. In addition, diamond is also highly inert in a chemical environment that might involve strong acid, strong base, strong oxidizing agent, or strong reducing agent, even at elevated temperatures or at cryogenic conditions. Furthermore, diamond has a high refractive index, which leads to its popular use in jewelry.

Though diamond is a versatile and premium material, its availability is limited in nature. Diamond mined from the earth is typically single crystal whose geometrical dimensions are limited in size and, often, too small for industrial uses that require large dimensions. Many times, diamond formed in nature contains impurities and crystal defects. A diamond crystal that is relatively large in crystal size, relatively pure in chemical contents, and relatively perfect without crystal defects is very expensive—often times, priceless.

Synthetic diamond is known to be produced industrially in chemical reactors under extremely high pressures and extremely high temperatures (the HTHP process). Due to such harsh synthetic conditions, the reactor size is limited, as are as the dimensions of the diamond. This process is also associated with high costs in process, equipment, and safety, related to harsh and demanding diamond growth conditions. Often times, the HTHP process produces diamond that has a yellow tint due to the incorporation of catalytic impurities into diamond lattices. In addition, the HTHP process is not able to produce diamond wafers of large diameter.

Industrially, diamond can also be grown in reactors in a process called chemical vapor deposition (CVD), where suitable growth conditions can be achieved by microwave-enhanced plasma, tungsten hot-filament, DC-Jet plasma, laser-induced plasma, acetylene-torch, etc. It is well known in the art that the CVD growth processes can also successfully grow polycrystalline diamond thin films on different substrates and/or free standing diamond thick films, though it is challenging to obtain low stress films or non-cracking diamond of significant size.

In many diamond applications, the surface of a diamond film, substrate, or window needs to be optically smooth for the purpose of transmitting light or electromagnetic waves, working as sound wave medium, as a substrate to reflect light/electromagnetic waves, or conduct heat energy away from electronics, photonics, or optoelectronics via a bonding mechanism such as brazing or gluing.

Because diamond is one of the hardest materials in the world, polishing diamond can be slow, expensive, and can generate a great deal of heat. Therefore, holding diamond in place by adhesive during polishing is not a good option since frictionally-generated heat can melt or destroy the adhesive. Moreover, diamond is also fragile and easy to shatter. In addition, the CVD growth of a diamond film, substrate, or window is a slow process, requiring expensive capital equipment, that uses a lot of electric energy for the diamond to grow in a very small area. Therefore, CVD diamond is expensive and many applications only require a thin diamond substrate or window if the requirement for one or more optically-finished diamond surface(s) can be fulfilled.

When a diamond film, substrate, or window is very thin (e.g., ≤400 microns in thickness), holding the diamond film, substrate, or window in place during polishing is challenging, particularly when the diamond film, window, or substrate reaches a thickness ≤400 microns, which is particularly true when the diamond film, substrate, or window has at least one large dimension (25 mm or greater), e.g. diameter. Beyond the limitations in polishing a thin diamond film, window, or substrate to an optically-finished surface(s), there are also challenges in successful polishing and fabricating diamond parts with a high aspect ratio (the ratio of the greatest dimension, e.g., without limitation, diameter, to the thickness), particularly when the aspect ratio of the diamond part is 100 or greater.

There is a need to produce large area diamond films, windows, or substrates that are thin and with one or both sides of the diamond surfaces optically finished. There is also a need to produce diamond films, windows, or substrates, thin (less than 400 microns in thickness) or thick (400 microns or thicker), having aspect ratios of 100 or greater, particularly for diamond parts having a largest dimension (e.g., without limitation, diameter) of 30 mm or greater. For light or electromagnetic wave management, a piece of diamond having a non-planar surface such as a dome, a cone, a pyramid, or any non-planar geometry is also needed for taking advantage of diamond's unique properties.

SUMMARY OF THE INVENTION

The thin diamond substrate or window described herein comprises at least one optically-finished surface and an aspect ratio of 100 or greater, or a combination of a thickness less 400 microns or thinner and a largest geometric dimension of 25 mm or greater.

The thickness of the thin diamond substrate or window can be ≤400 microns, ≤350 microns, ≤300 microns, ≤250 microns, or ≤200 microns. The largest dimension of the thin diamond substrate or window can be ≥25 mm, ≥40 mm, ≥50 mm, ≥60 mm, ≥80 mm, or ≥100 mm. The aspect ratio of the thin diamond substrate or window can be ≥100, ≥125, ≥150, ≥175, or ≥200.

The CVD diamond described herein can grow on a sacrificial substrate, made of, in an example, silicon, whose surface(s) can, optionally, be optically finished. The surface of as-grown diamond can be polished via a conventional polishing process to a level of optical finishing with a surface roughness (Ra) of ≤50 nm, ≤30 nm, ≤20 nm, ≤15 nm, or ≤10 nm. Then, the sacrificial substrate on which the diamond is grown can be removed (chemically and/or mechanically) to produce a piece of free-standing diamond film, substrate, or window with at least one optically-finished surface.

If CVD diamond grows on the surface of the sacrificial substrate that is optically finished (e.g., a surface roughness, Ra, of ≤20 nm, ≤15 nm, ≤10 nm, ≤5 nm, or ≤2 nm), the nucleation side of the CVD grown diamond will have a surface roughness, Ra, that closely matches the surface roughness of the sacrificial substrate. In an example, the nucleation side of the CVD grown diamond will have a Ra of ≤50 nm, ≤30 nm, ≤20 nm, ≤15 nm, or ≤10 nm for a Ra of the substrate of ≤20 nm, ≤15 nm, ≤10 nm, ≤5 nm, or ≤2 nm respectively. After the diamond is CVD-grown on the surface of the sacrificial substrate, the side of the CVD grown diamond facing away from the sacrificial substrate can optionally be polished via a conventional polishing process. If the CVD diamond described herein grows on the surface of a sacrificial substrate that is not optically finished (for example, a chemically etched and/or mechanically-finished surface), then the growth side surface of the CVD grown diamond can be polished via a conventional polishing process whereupon the CVD grown diamond would only have one surface finished optically on the growth side (a surface roughness (Ra) of ≤50 nm, ≤30 nm, ≤20 nm, ≤15 nm, or ≤10 nm).

The same process is also applicable to produce a piece of diamond that has a non-planar optically-finished surface (a surface roughness (Ra) of ≤50 nm, ≤30 nm, ≤20 nm, ≤15 nm, or ≤10 nm). In an example, non-planar surfaces can comprise a dome, a cone, a pyramid, asphere, parabola, and hyperbola, or other non-planar geometry. Also disclosed is a process of producing the thin diamond window or substrate described herein. Also disclosed are tailored growth conditions for growing the thin diamond substrate or window that has at least one optically-finished surface.

Various preferred and non-limiting examples or aspects of the present invention will now be described and set forth in the following numbered clauses.

Clause 1. A diamond film, substrate or window comprises: at least one optically-finished surface; and an aspect ratio of a largest dimension of the diamond film, substrate or window divided by a thickness of the diamond film, substrate or window of ≥100.

Clause 2. The diamond film, substrate or window of clause 1, wherein the diamond film, substrate or window has a thickness of ≤400 microns (≤0.4 mm) and the largest dimension ≥25 mm.

Clause 3. The diamond film, substrate or window of either clause 1 or 2, wherein the diamond film, substrate or window has at least one optically-finished surface having a surface roughness (Ra)≤50 nm, or ≤30 nm, or ≤20 nm, or ≤15 nm, or ≤10 nm.

Clause 4. The diamond film, substrate or window of any of clauses 1-3, wherein the largest dimension is ≥25 mm, ≥40 mm, or ≥50 mm, or ≥60 mm, or ≥70 mm, or ≥80 mm, or ≥100 mm.

Clause 5. The diamond film, substrate or window of any of clauses 1-4, wherein the thickness is ≤400 microns, or ≤350 microns, or ≤300 microns, or ≤250 microns, or ≤200 microns.

Clause 6. The diamond film, substrate or window of any of clauses 1-5, wherein the aspect ratio is ≥125, or ≥150, or ≥175, or ≥200.

Clause 7. The diamond film, substrate or window of any of clauses 1-6, wherein the largest dimension is a diameter of the diamond film, substrate or window.

Clause 8. The diamond film, substrate or window of any of clauses 1-7, wherein a 1.06 micron light scattering coefficient of the diamond film, substrate or window, at a distance of 34 cm distance from a blocking lens is ≤20/cm, or ≤15/cm, or ≤10/cm, or ≤7/cm, or ≤5/cm.

Clause 9. The diamond film, substrate or window of any of clauses 1-8, wherein the diamond film, substrate or window has a diamond nucleation density ≥$1.0 \times 10^5$/cm$^2$, or ≥$1.0 \times 10^6$/cm$^2$, or ≥$1.0 \times 10^7$/cm$^2$, or ≥$1.0 \times 10^8$/cm$^2$, or ≥$1.0 \times 10^9$/cm$^2$.

Clause 10. A method of forming a diamond film, substrate, or window comprises: (a) providing a silicon substrate; and (b) CVD growing on a surface of the silicon substrate a diamond film, substrate, or window having an aspect ratio ≥100, wherein the aspect ratio is a ratio of a largest dimension of the diamond film, substrate or window divided by a thickness of the diamond film, substrate or window.

Clause 11. The method of clause 10, wherein the silicon substrate has a thickness ≥2 mm, or ≥4 mm, or ≥6 mm, or ≥8 mm.

Clause 12. The method of either clause 10 or 11, further including, prior to step (b), polishing the surface of the silicon substrate to an optical finish having a surface roughness (Ra) ≤20 nm, or ≤15 nm, or ≤10 nm, or ≤5 nm, or ≤2 nm.

Clause 13. The method of any of clauses 10-12, wherein: a nucleation side of the as-grown diamond film, substrate, or window has an Ra greater than the Ra of the polished surface of the silicon substrate; and for an Ra of the polished the surface of the silicon substrate ≤20 nm, or ≤15 nm, or ≤10 nm, or ≤5 nm, or ≤2 nm, the Ra of the nucleation side of the as-grown diamond film, substrate, or window is ≤50 nm, or ≤30 nm, or ≤20 nm, or ≤15 nm, or ≤10 nm, respectively.

Clause 14. The method of any of clauses 10-13, wherein the surface of the silicon substrate and a nucleation side of the as-grown diamond film, substrate, or window each have a surface roughness (Ra)≥750 nm.

Clause 15. The method of any of clauses 10-14, further including, while the diamond film, substrate, or window is still on the silicon substrate, polishing a growth surface of the diamond film, substrate, or window to a surface roughness (Ra)≤50 nm, or ≤30 nm, or ≤20 nm, or ≤15 nm, or ≤10 nm.

Clause 16. The method of any of clauses 10-15, wherein: the surface of the silicon substrate and a nucleation side of the as-grown diamond film, substrate, or window are non-planar; and a shape of the nucleation side of the as-grown diamond film, substrate, or window is a conformal negative of the shape of the surface of the silicon substrate.

Clause 17. The method of any of clauses 10-16, wherein the nucleation side of the as-grown diamond film, substrate, or window has one of the following shapes: dome, cone, pyramid, asphere, parabola, and hyperbola.

Clause 18. The method of any of clauses 10-17, further including chemically or mechanically removing the silicon substrate from the grown diamond film, substrate, or window.

Clause 19. The method of any of clauses 10-18, wherein a growth side of the as-grown diamond film, substrate, or window has a greater thermal conductivity than the nucleation side of the as-grown diamond film, substrate, or window.

Clause 20. The method of any of clauses 10-19, further including: applying a light management coating to a growth surface of the grown diamond film, substrate, or window; and/or after removing the silicon substrate from the grown diamond film, substrate, or window, applying the light management coating to a nucleation side of the grown diamond film, substrate, or window.

Clause 21. The method of any of clauses 10-20, further including cutting the silicon substrate having the diamond film, substrate, or window grown thereon into one or more pieces.

Clause 22. The method of any of clauses 10-21, wherein step (b) includes CVD growing the diamond film, substrate, or window in an atmosphere that includes at least one of the following: oxygen, carbon monoxide, carbon dioxide, nitrogen, and boron.

Clause 23. The method of any of clauses 10-22, wherein, prior to step (b), the surface of the silicon substrate is seeded with diamond particles Clause 24. The method of any of clauses 10-23, wherein the silicon substrate is seeded with diamond particles via at least one of the following processes: (1) ultrasonic treatment of the silicon substrate in a bath of aqueous diamond slurries or organic diamond slurries, or (2) rubbing the silicon substrate with diamond powers, or (3) diamond turning the silicon substrate.

Clause 25. The method of any of clauses 10-24, wherein the silicon substrate is seeded with diamond particles via at least one of the following processes: (1) ultrasonic treatment of the silicon substrate in a ultrasonic bath comprised of a submicron or micron-sized diamond powder in a liquid suspension solution; and (2) ultrasonic treatment of the silicon substrate in a ultrasonic bath comprised of nanocrystal diamond powder having an average particle size <100 nm in a liquid suspension solution. The liquid suspension solution can comprise one or more of the following: water, alcohol, hydrocarbon, or other organic solvent.

Clause 26. The method of any of clauses 10-25, wherein the largest dimension of the silicon substrate is ≥25 mm, or ≥50.8 mm, or ≥66 mm, or ≥76 mm, or ≥101 mm, or ≥127 mm.

Clause 27. The method of any of clauses 10-26, wherein the largest dimension of the silicon substrate is a diameter of the silicon substrate.

Clause 28. A diamond-silicon composite substrate comprises a diamond film, substrate, or window CVD grown on a silicon substrate, wherein the diamond-silicon composite substrate has a total thickness ≥200 microns, or ≥300 microns, or ≥500 microns, or ≥1 mm, or ≥2 mm, or ≥5 mm, and a diameter of the diamond-silicon composite substrate is ≥20 mm, or ≥30 mm, or ≥40 mm, or ≥50 mm, or ≥75 mm, or ≥100 mm, or ≥125 mm, or ≥150 mm.

BRIEF DESCRIPTION OF THE DRAWINGS

FIGS. 5A-5F are various shaped diamond films, windows, or substrates that can be conformingly grown on a "negative" sacrificial substrate in the microwave plasma CVD reactor of FIG. 2 in accordance with the principles described herein;

DETAILED DESCRIPTION

Figure 1A:
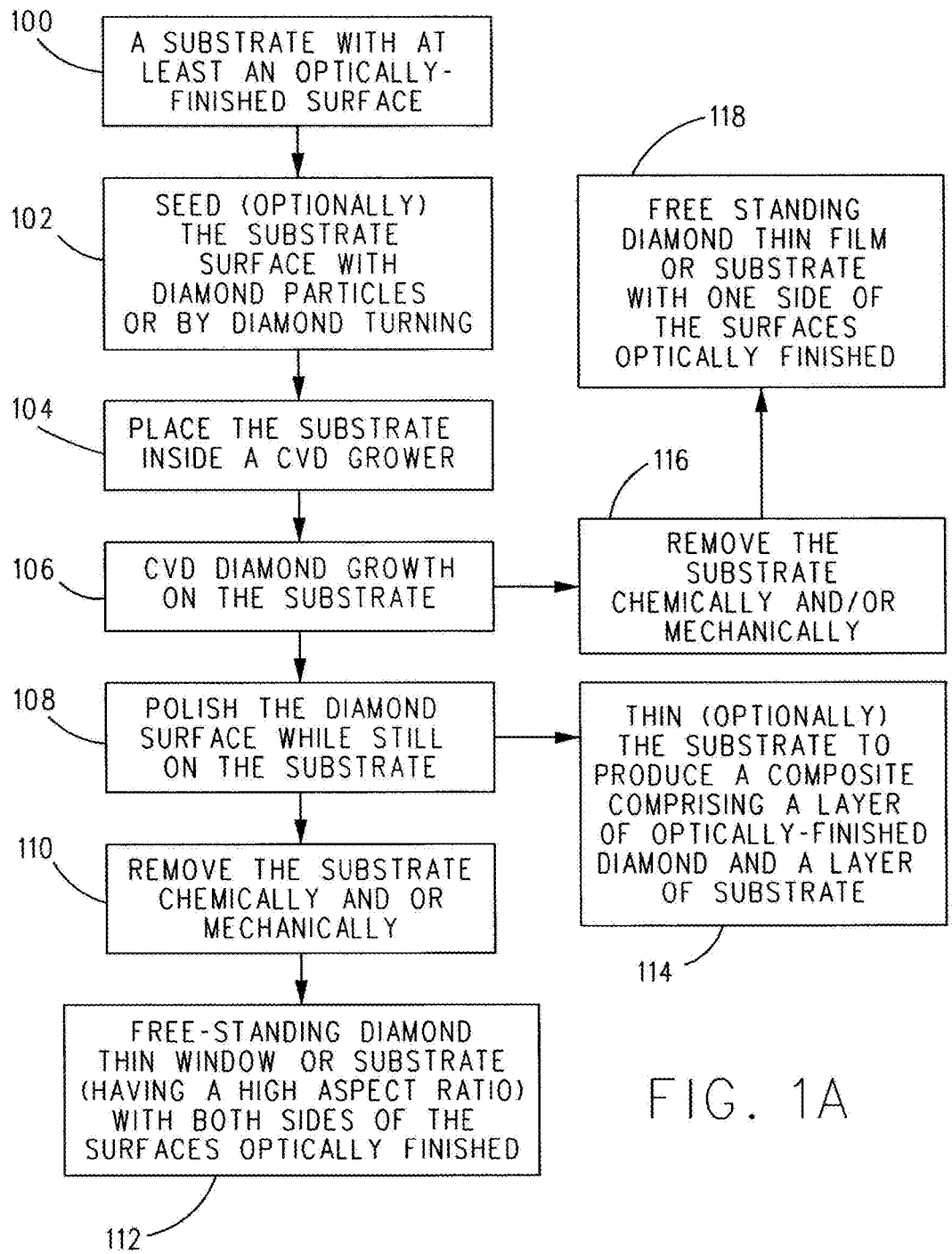
FIG. 1A is a flow diagram of an example method of CVD growing a diamond film, window, or substrate on a sacrificial substrate, wherein, in one path of the method, only the nucleation side or surface of the grown diamond film, window, or substrate will have an optically-finished surface, and, in another path of the method, both the nucleation side or surface and the growth side or surface of the grown diamond film, window, or substrate will have optically-finished surfaces.

The following examples will be described with reference to the accompanying figures where like reference numbers correspond to like or functionally equivalent elements.

In an example, a diamond film, window, or substrate can comprise at least one optically-finished surface and an aspect ratio of 100 or greater. In another example, a diamond film, window, or substrate can comprise the combination of a thickness of 400 microns or thinner and a geometric dimension (a largest dimension) of 25 mm or greater. The optically-finished surface can have a surface roughness, Ra, of ≤50 nm, ≤30 nm, ≤20 nm, ≤15 nm, or ≤10 nm.

The diamond film, window, or substrate can have a largest geometric dimension of ≥25 mm, ≥40 mm, ≥50 mm, ≥60 mm, ≥70 mm, ≥80 mm, or ≥100 mm.

The diamond film, window, or substrate can be ≤400 microns, ≤350 microns, ≤300 microns, ≤250 microns, or ≤200 microns.

An aspect ratio of the diamond film, substrate, or window (defined herein as the ratio of the largest dimension of the diamond film, substrate, or window to the thickness of the diamond film, substrate, or window) can be ≥100, ≥125, ≥150, ≥175, or ≥200.

For transmitting optical light or electromagnetic waves, one or both surfaces of the diamond film, window, or substrate can be optically finished. High quality diamond having a low absorption of light energy can be desirable. Indeed, a small amount of light absorption can be desirable. According to Beer-Lambert Law, $$A = \text{Log}\left(\frac{I}{I_0}\right) = \varepsilon_\lambda \cdot l \cdot c$$

where A is absorption of the light; I is the transmitted light intensity; $I_0$ is the incident light intensity; $\varepsilon_\lambda$ is the extinctive coefficient; l is the length of the light path; and c is concentration of the light absorbing molecules.

One way to reduce light absorption through a diamond film, window, or substrate is to reduce the length of the light path, in an example, the thickness of the light-transmitting diamond film, window, or substrate, l, assuming no changes in the quality of the diamond. Light scattering while transmitting through a diamond film, window, or substrate can also be directly correlated to the length of the light path (which, for light traveling perpendicular to a thickness of the diamond film, substrate, or window, is the same as the thickness of the diamond film, substrate, or window). In an example, a thin diamond film, substrate, or window can have both side surfaces optically-finished for the purposes of having a minimum amount of light being absorbed and/or being scattered.

For an application reflecting optical light or electromagnetic waves, or bonding to a device of electronics, photonics, optoelectronics (such as, but not limited to, a laser diode, a laser diode array (bar), a vertical-cavity surface emitting laser, an array of vertical-cavity surface emitting lasers, a light-emitting-device, etc.), etc., for thermal management, at least one surface of the diamond film, window, or substrate can be optically finished. The thickness of diamond film, window or substrate for reflecting electromagnetic waves can be a few microns (1-9), a few tens of microns, e.g., between 10-99 microns, or a few hundred (100-999) microns. In an example, the thinner the diamond film, window, or substrate, the less the cost. In an example, for thermal management, a diamond film, window, or substrate of a thickness of 150 to 200 microns, in many applications can be sufficient to conduct heat energy away from a heat source. Therefore, a diamond film, window, or substrate thicker than required in an application, such as reflecting electromagnetic waves or thermal management, simply represents added cost and may not be necessary.

Herein, words such as film, window, and substrate may be used interchangeably, either individually or in combination, when referring to the diamond films, windows, substrates described herein.

Diamond is a hard material and simultaneously very brittle. When a diamond film is thin (e.g., ≤400×10$^{-6}$ meters), and when the largest geometric dimension is large, a piece of diamond film, becomes very fragile. Growing a piece of diamond film, for example, via CVD, that is thin in thickness and large in its longest dimension by itself is challenging.

An example prior art polycrystalline diamond film growth process includes growing a diamond film on a metallic substrate at elevated temperatures until the diamond film reaches a certain thickness, whereupon the diamond film undesirably delaminates from the metallic substrate due to differences in coefficient of thermal expansion (CTE) between the diamond film (1×10$^{-6}$ meter/meter-Kelvin) and the CTE of the metallic substrate (4.6×10$^{-6}$ meter/meter-Kelvin for tungsten, 5.0×10$^{-6}$ meter/meter-Kelvin for molybdenum, etc.). When the thickness of the diamond film on the metallic substrate is 1 mm or thicker, the diamond film can survive delamination, but can often undesirably crack, which reduces the potential to cut out (harvest) diamond parts from the diamond film. When the diamond film thickness is thinner than 500 microns, the problem of shattering or cracking of the diamond film becomes typical. When the diamond film thickness is 300-400 microns or thinner, it becomes difficult to harvest a piece of uncracked or unshattered diamond film that is significant in size from a metallic substrate (like tungsten or molybdenum). Therefore, in the prior art, producing a thin (e.g., ≤400×10$^{-6}$ meter) diamond film, window, or substrate that has one or more optically-finished surface(s) and has a significant largest dimension, in an example, diameter, would have to start from a thick as-grown diamond film, assuming a conventional thinning/polishing processes is used. This results in an expensive growth and fabrication process.

As stated previously, diamond is hard and brittle. Diamond film becomes fragile when it is thin in thickness and has a large dimension, e.g., diameter. Diamond is also inert. Polishing a diamond is mainly done with mechanical forces involving diamond particles. Therefore, holding a piece of thin diamond in place during polishing become challenging, particularly when the diamond thickness is ≤400 microns and the largest dimension, e.g., diameter, is ≥40 mm. When the thickness of diamond film gets thinner, e.g., ≤300 microns, polishing a piece of diamond that is 25 mm or greater in largest dimension becomes nearly impossible. Therefore, it is not only expensive, but also difficult to use a piece of thick as-grown diamond wafer to produce a piece of thin diamond film, window, or substrate in a conventional way, that is significant in its largest dimension and has at least one optically-finished surface.

Figure 1B:
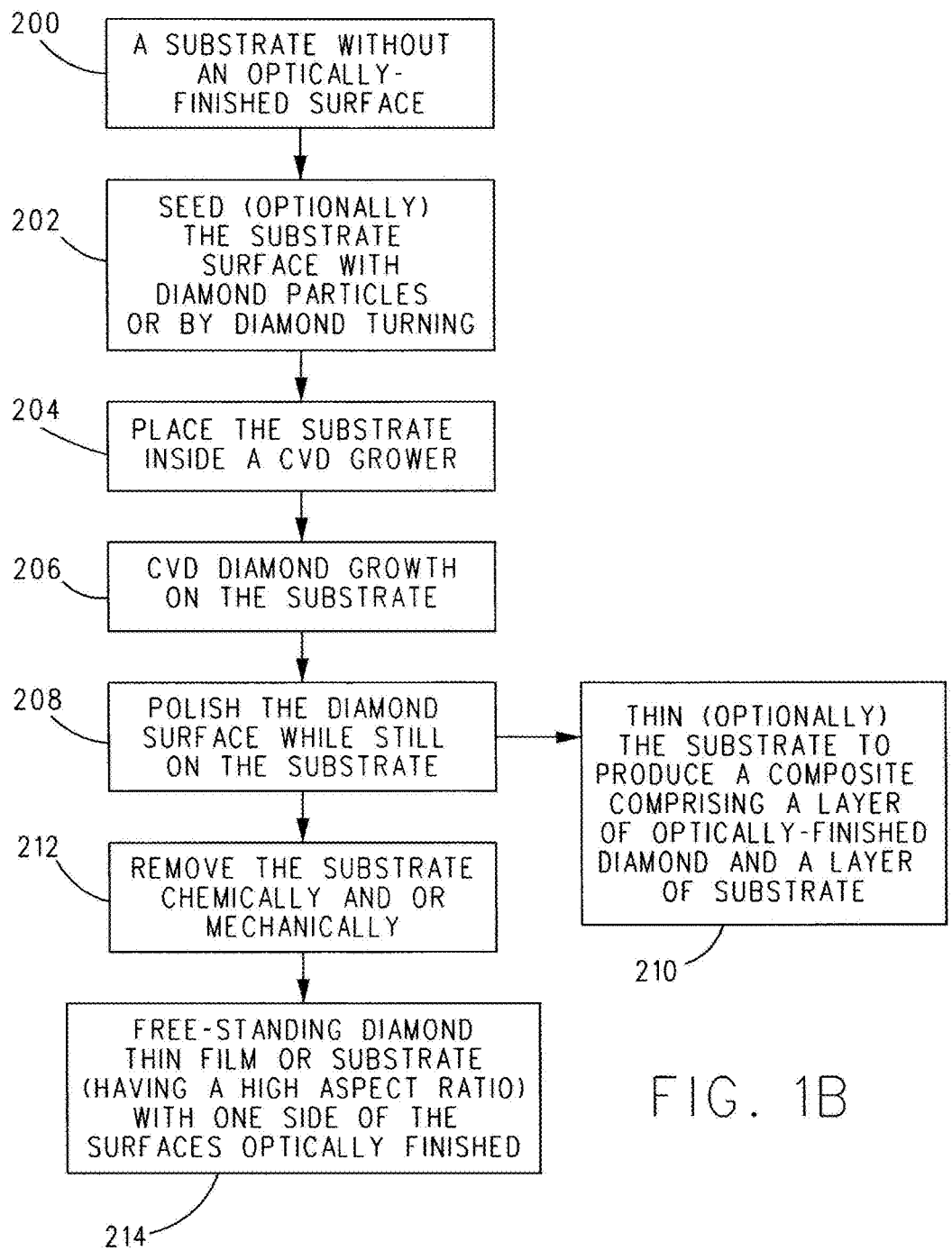
FIG. 1B is a flow diagram of an example method of CVD growing a diamond film, window, or substrate on a sacrificial substrate, wherein the nucleation side or surface of the grown diamond film, window, or substrate will not have an optically-finished surface and the growth side or surface of the grown diamond film, window, or substrate will have an optically-finished surface.

Examples of methods of producing thin diamond films, substrates, or windows in accordance with the principles described herein are illustrated in the flow charts of FIGS. 1A and 1B. The examples described herein use a sacrificial substrate (such as silicon) that is large in one dimension, e.g., diameter.

With reference to FIG. 1A, an example of producing a diamond film having one or both surfaces with an optical finish will now be described with reference to the flow diagram of FIG. 1A.

In step 100 a substrate is provided having at least one optically-finished surface. In step 102, the optically-finished surface is optionally seeded with diamond particles or by diamond turning. In step 104, the substrate with the optically-finished surface (seeded or unseeded) is placed inside of a CVD grower (e.g., the CVD reactor 16 shown in FIG. 2). In step 106, a diamond film is CVD grown on the substrate.

In an example where it is desired that the diamond film have only one surface (the nucleation surface) with an optical finish, following step 106, step 116 is performed wherein the substrate material is removed chemically and/or mechanically. Because the nucleation surface of the diamond film was CVD grown on the surface of the substrate having an optical finish, removal of the substrate in step 116 produces in step 118 a free-standing diamond film with one side (the nucleation side) having a surface that is optically-finished.

In an example where it is desired that the growth side surface of the diamond film have an optical finish, following step 106, step 108 is performed wherein the growth surface of the diamond film is polished while still on the substrate. In an example where it is desired to produce a composite substrate comprising the polished diamond growth surface and a layer of the substrate material, following step 108, step 114 is performed wherein the substrate layer is thinned to produce the composite substrate comprising the growth surface of the diamond film polished to an optical finish adhered to the substrate.

Alternatively, in an example where it is desired to have a diamond film having both surfaces with an optical finish, following step 108, step 110 is performed wherein the substrate material is removed chemically and/or mechanically. Because the nucleation surface of the diamond film was CVD grown on the surface of the substrate having an optical finish, and because the growth surface of the diamond film was polished in step 108, removal of the substrate in step 110 produces in step 112 a free-standing diamond film with both sides (the growth side and the nucleation side) having surfaces that are optically-finished.

Referring now to FIG. 1B, an example of producing a diamond film with an optically-finished surface on the growth side will now be described. In step 200, a substrate is provided without an optically-finished surface. In step 202, the substrate surface on which the diamond film to be CVD grown is optionally seeded with diamond particles and/or by diamond turning. Next, in step 204, the substrate (seeded or unseeded) is placed inside of a CVD grower (e.g., the CVD reactor 16 shown in FIG. 2). In step 206 diamond film is CVD grown on the substrate.

In step 208, the growth surface of the diamond film is polished while still on the substrate. Where it is desired to produce a composite substrate comprising the growth surface of the diamond film polished to an optical finish adhered to the substrate, the method advances to step 210 wherein the substrate is thinned to produce said composite substrate.

Where it is desired to produce a free-standing diamond film having a single optically finished surface, the method advances from step 208 to step 212 wherein the substrate is removed chemically and/or mechanically to produce, in step 214, a free standing diamond film with the growth surface of the diamond film having an optically-finished surface and with the nucleation side of the diamond film having a non-optically finished surface by virtue of the nucleation side growing on the side of the substrate without an optically-finished surface.

The coefficient of thermal expansion (CTE) for silicon is about $3.0 \times 10^{-6}$ meter/meter-Kelvin, while the CTE for diamond is about $1.0 \times 10^{-6}$ meter/meter-Kelvin. Diamond film is typically grown at elevated temperatures. Upon completion of diamond film growth on a substrate (sacrificial or permanent), the temperature drops substantially from the diamond growth temperature to room temperature, whereupon the CTE mis-match between the grown diamond film and the substrate (such as silicon) normally leads to cracking of the diamond film and/or the substrate. This is particularly severe when the substrate, such as silicon, is large in one or more dimensions. In addition, unlike metallic substrates, such as tungsten and molybdenum, silicon is brittle and cannot survive the CVD plasma start-up during a CVD diamond growth process.

In the section Comparative Example 1 hereinafter, silicon wafers (6" in diameter and 625 microns in thickness) were used as sacrificial substrates for growth of diamond films. Unfortunately, each of these silicon wafers shattered during the plasma tuning process.

It was surprising to discover that only a piece of thick ($\geq 2$ mm) sacrificial substrate, such as a silicon disc, can survive the plasma tuning process. In an example, the silicon disc can be $\geq 2$ mm in thickness, $\geq 4$ mm in thickness, $\geq 6$ mm in thickness, or $\geq 8$ mm in thickness.

Another example is to use a sacrificial substrate, such as silicon, with an optically-finished surface for CVD diamond growth. After CVD diamond growth on said sacrificial substrate, the sacrificial substrate can be chemically (by caustic or by hydrogen fluoride) and/or mechanically (by grinding and/or lapping) removed, which results in an optically-finished diamond surface (on the nucleation side) without involving a conventional polishing process. This leads to efficient and economical production of a thin piece of free-standing diamond film that has an optically-finished surface on the nucleation side.

Another example is to polish the as-grown diamond (growth) surface (opposite the nucleation side) while the diamond film is still on the sacrificial substrate (for example, silicon). In this case, the total thickness of the combination diamond film and sacrificial substrate can be thick enough to allow a conventional polishing process to hold and polish the combination without significant risk of shattering the diamond film during the polishing process. After achieving an optical-level finish on the growth side of the as-grown diamond film, the combination diamond film and sacrificial substrate can go through a sacrificial substrate removal process, chemically and/or mechanically. At the end of this process, the thin piece of diamond film, includes both surfaces (growth and nucleation) with optically finishes.

It is known that the growth side of a polycrystalline diamond film can have a better thermal conductivity than the nucleation side of the diamond film. In this case, only the growth side surface of the diamond needs to be optically finished. Therefore, in another example a sacrificial substrate, such as silicon, without optical finishing (e.g., a chemically-etched and/or mechanically-lapped surface) can be used as the sacrificial substrate.

In an example, the nucleation side of a piece of diamond film grown on a sacrificial substrate can be superior in its thermal conductivity compared to other, conventional thermal management materials such as copper. Therefore, having the nucleation side of the diamond surface optically finished is sufficient. In this case, another example is to use sacrificial substrate, such as silicon, with an optically finished surface for the nucleation side of the diamond film. After diamond film growth, the growth surface (opposite the nucleation side) can be optionally lapped flat, followed by removal of the sacrificial substrate by chemical etching and/or by mechanical lapping/grinding. This process can result in a thin (e.g., $\leq 400 \times 10^{-6}$ meters) diamond film that has an optically-finished surface on the nucleation side without resort to a conventional polishing process, avoiding the risk of shattering or breaking during polishing of the diamond film.

In another example, after CVD growing a diamond film on a sacrificial substrate that has at least one optically-finished surface, the optically-finished (nucleation) surface of the diamond film (after removal of the sacrificial substrate) can be coated with a light management coating such as, for example, an antireflective coatings, a beam splitter coating, a total reflective coating, etc. Such diamond film can also be laser-cut into different geometric dimensions for specific applications. Laser-cutting can be carried out while the diamond layer is still on the sacrificial substrate (such as silicon), wherein, prior to laser-cutting, the as-grown diamond surface can be optionally lapped and/or polished.

In an example, the diamond film can be of optical quality (having a low absorption of the electromagnetic waves such as infrared light, near infrared light, visible light, or UV light, having an absorbance of 0.5/cm or lower). In an example, the diamond film can also have a low loss tangent for microwave applications (having a loss tangent of $1 \times 10^{-2}$ or lower). In an example, the diamond film can also be mechanical and/or thermal grade diamond (which can be dark in color, and can have a thermal conductivity of 800 watt/m-K or greater). In an example, the diamond film can also be a detector grade diamond (having a charge collection distance of 100 micron or greater) and/or electrochemical grade diamond.

In an example, the diamond film can be grown via the microwave-assisted plasma CVD process, the hot-filament CVD process, the thermal spray CVD process, the arc discharge plasma CVD process, the direct current thermal plasma CVD process, the radio-frequency plasma CVD process, the water-based plasma CVD process, the acetylene touch plasma CVD process, the very high frequency plasma CVD process, etc.

In an example, the growth temperature for the diamond film can range from 600° C. to 1300° C. or higher. In an example, the growth rate of the diamond film can be submicron per hour to 20 microns per hour or higher. In an example, the methane concentration for CVD growing the diamond film can range from less than 1% to as high as 5% in hydrogen. In an example, other additives, such as oxygen, carbon monoxide, carbon dioxide, nitrogen, boron, etc., can also be added into the CVD growth environment for the purpose of diamond growth rate control and/or diamond quality control.

In an example, the surface of the sacrificial substrate, such as silicon, either optically-finished or not, can be seeded with diamond particles by ultrasonic treatments; with aqueous diamond slurries or organic diamond slurries; by rubbing with diamond powers or slurries; or by diamond turning.

In an example, the sacrificial substrate, such as silicon, for diamond growth, can be ≥25 mm in diameter, ≥2" (50.8 mm) in diameter, ≥66 mm in diameter, ≥3" (76.2 mm) in diameter, ≥4" (101.6 mm) in diameter, or ≥5" (127 mm) in diameter.

In an example, the thickness of the sacrificial substrate, such as silicon, can be ≥2 mm, ≥4 mm, ≥6 mm, or ≥8 mm.

In an example, the surface of a sacrificial substrate (in an example silicon) can be optically finished, chemically etched, and/or mechanically finished, such as via lapping and/or polishing. In an example, the surface roughness, Ra, of the optically finished surface of the sacrificial substrate (in an example silicon) can be ≤20 nm, ≤15 nm, ≤10 nm, ≤5 nm, or ≤2 nm.

Figure 5A:
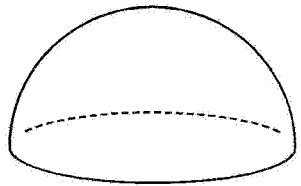
Figure 5B:
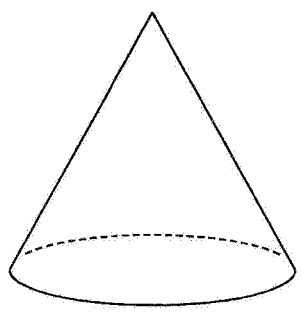
Figure 5C:
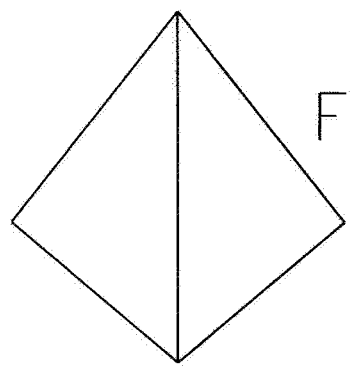
Figure 5D:
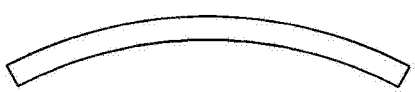

In an example, for non-planar-shaped diamond structures, such as, for example, domes (FIG. 5A), cones (FIG. 5B), pyramids (FIG. 5C), asphere (FIG. 5D), parabola (FIG. 5E), hyperbola (FIG. 5F), and any other non-planar geometries that required an optically-finished surface of the diamond structure, it is difficult to polish the diamond surface. Even if it were possible, the polishing of a piece of thick and large dimension diamond block into such non-planar shape would require excessive time and costs and the amount of diamond wasted would be extreme. Therefore, in an example, CVD diamond can be grown onto a sacrificial substrate (such as silicon) that has an optically finished surface contour negative of the desired contour or shape of the final diamond substrate. After diamond growth, the sacrificial substrate (such as silicon) can be chemically removed by etching (using, for example, KOH or HF) and/or mechanically removed by grinding and lapping. In an example, the contour of the non-planar surface of the sacrificial substrate on which diamond film is to be CVD grown can be fabricated by a diamond turning process or by a typical optical fabrication process. The non-planar surface of the sacrificial substrate can be made to any suitable and/or desirable shape that can be formed using one or more typical fabrication processes, such shapes including for example domes (FIG. 5A), cones (FIG. 5B), pyramids (FIG. 5C), asphere (FIG. 5D), parabola (FIG. 5E), hyperbola (FIG. 5F) and any other non-planar geometries.

The diamond film examples described herein can be used as an optical window for light/electromagnetic wave management; a substrate for thermal management for electronics, photonics, and optoelectronics; a substrate for uses involving chemical inertness, sound wave management, electromagnetic wave management, friction control, and detector; and a material for mechanical uses in, such as, but not limited to, milling, cuffing, drilling, lacing, etc.

In another example, the diamond film, substrate or window can have a 1.06 micron wavelength light scattering coefficient at a 34 cm distance from a blocking lens of ≤20/cm, or ≤15/cm, or ≤10/cm, or ≤7/cm, or ≤5/cm. Such light scattering coefficient can be desirable for optical applications, thermal management applications, acoustic management applications, etc.

In another example, the diamond film, substrate or window, can have a diamond nucleation density $\geq 1.0 \times 10^5/cm^2$, or $\geq 1.0 \times 10^6/cm^2$, or $\geq 1.0 \times 10^7/cm^2$, or $\geq 1.0 \times 10^8/cm^2$, or $\geq 1.0 \times 10^9/cm^2$. Such diamond nucleation density can be desirable for transporting: acoustic waves for acoustic management; phonons for thermal management; and photons for light management. Such diamond nucleation density can also be desirable for: mechanical applications: for chemical inertness where low porosity is desirable; for surface friction control, etc.

The following examples and comparative examples are for the purpose of illustration, and not of limitation.

Images of Scanning Electron Microscopy (SEM) were collected on a scanning electron microscope equipped with an energy dispersive analysis X-Ray (EDAX) detector.

Raman spectra were collected by a Raman Microscope (confocal). Raman spectroscopy is widely used as a standard for the characterization of diamond, single crystal or polycrystalline. It provides readily distinguishable signatures of each of the different forms (allotropes) of carbon (e.g., diamond, graphite, buckyballs, etc.). Combined with photoluminescence (PL) technology, it offers a non-destructive way to study various properties of diamond including phase purity, crystal size and orientation, defect level and structure, impurity type and concentration, and stress and strain. In particular, the width (full-width-half-maximum, FWHM) of the first order diamond Raman peak at 1332 cm$^{-1}$, as well as the Raman intensity ratio between diamond peak and graphitic peaks (D-band at 1350 cm$^{-1}$ and G-band at 1600 cm$^{-1}$), is a direct indicator of diamond quality. Furthermore, the stress and strain levels in diamond grains and films can be estimated from diamond Raman peak shift. It has been reported that the diamond Raman peak shift rate under hydrostatic stress is about 3.2 cm$^{-1}$/GPa, with the peak shifting to lower wavenumber under tensile stress and higher wavenumber under compressive stress. The Raman spectra presented hereinafter were collected using a Raman spectroscope with 514 nm excitation laser.

Surface roughness (Ra) and Peak-to-Valley (PV) measurements of the surface of a piece of polished diamond film or a piece of silicon were obtained via an interferometer with a 20× Objective lens. The measured area was 200 microns by 350 microns.

Figure 2:
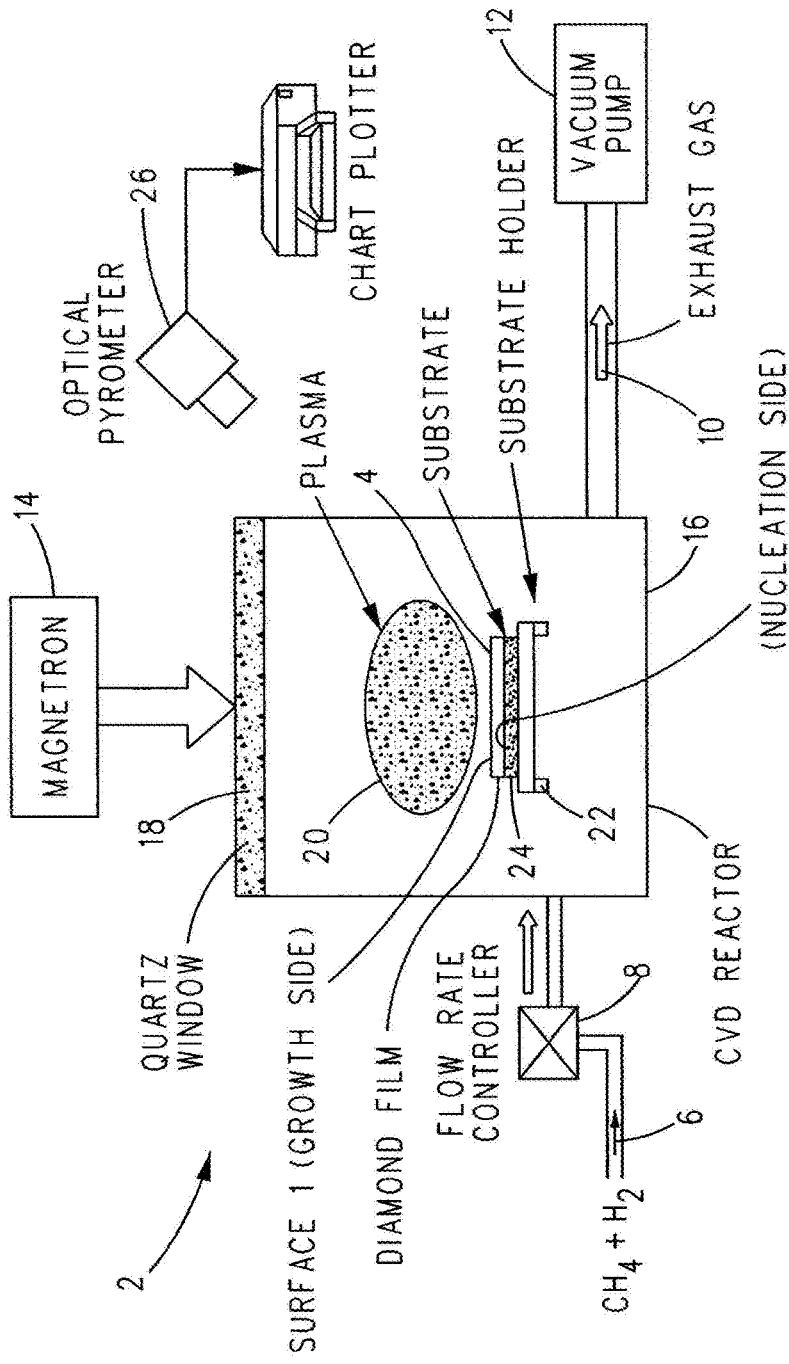
FIG. 2 is an example microwave plasma CVD reactor that can be used to grow a diamond film, window, or substrate on a sacrificial substrate (such as silicon)

Chemical vapor deposition of diamond enhanced by microwave plasma is well known in the art. FIG. 2 shows a schematic diagram of an example microwave plasma CVD system 2 that can be used to grow polycrystalline diamonds 4 in the manners described herein. In use of the CVD system 2 shown in FIG. 2, a mixture of reactive gases 6, comprising hydrogen and methane is flowed into a microwave plasma CVD reactor 16. The flow rate of the mixture of reactive gases 6 is controlled by a mass flow controller 8. Exhausted gas 10 flows out CVD reactor 16, typically to a vacuum pump 12. Microwave energy is typically generated by a magnetron 14 and guided to CVD reactor 16 through a quartz window 18. Inside reactor 16, the microwave energy is converted into a plasma 20 which radicalizes the hydrogen molecules of reactive gases 6 into hydrogen free radicals, as well as methane molecules of reactive gases 6 into methyl free radicals, methylene free radicals, methyne free radicals, and the secondary or tertiary free radicals that contain two or more carbons. At the bottom of CVD reactor 16, there sits a substrate holder 22 or support that supports a substrate 24 upon which polycrystalline diamond film 4 grows. A substrate 24 of silicon, titanium, niobium, molybdenum, tungsten, tantalum, or any suitable carbide formers can sit on the substrate holder 22.

While plasma 20 is on, the radicalized free radicals that contain carbon species bombard the surface of substrate 24, which leads to fixation of the carbon species by a mechanism called "hit and stick". The hydrogen free radicals produced by plasma 20 bombard the fixed surface carbon species that still contain hydrogen atoms, and abstract the hydrogen atoms off such fixed carbon species, resulting in the formation of surface carbon free radicals for forming C—C bonds containing less number of hydrogen atoms until all hydrogen atoms are abstracted. Some pure carbon to carbon bonding can be $sp^3$ in nature, which is desirable for a diamond lattice. Some pure carbon to carbon bonding can be $sp^2$ in nature, which is undesirable since it is graphitic in nature. However, the hydrogen free radicals are able to strip $sp^2$ carbon off the graphitic species faster than strip $sp^3$ carbon off the diamond lattice.

It is well known in the art that the concentrations of hydrogen and methane in the mixture of reactive gases 6 are critical parameters for diamond growth, in addition to the growth temperature, if the plasma 20 size is tuned into a size that is large enough to cover the surface of substrate 24. The microwave power and pressure inside of rector 16 are highly substrate-size-dependent. A person skilled in the art should be able to follow the procedures and instructions disclosed herein to tune plasma 20 to a proper size that is large enough to cover substrates 24 of different sizes for the purposes of seeding, deposition and growth of a quality diamond film, window, or substrate.

In each of the following examples and comparative examples, the reference numbers shown in FIG. 2 will be used for like or functionally equivalent elements.

Example 1: Producing Diamond Films with One Surface Having an Optical Finish

Figure 3A:
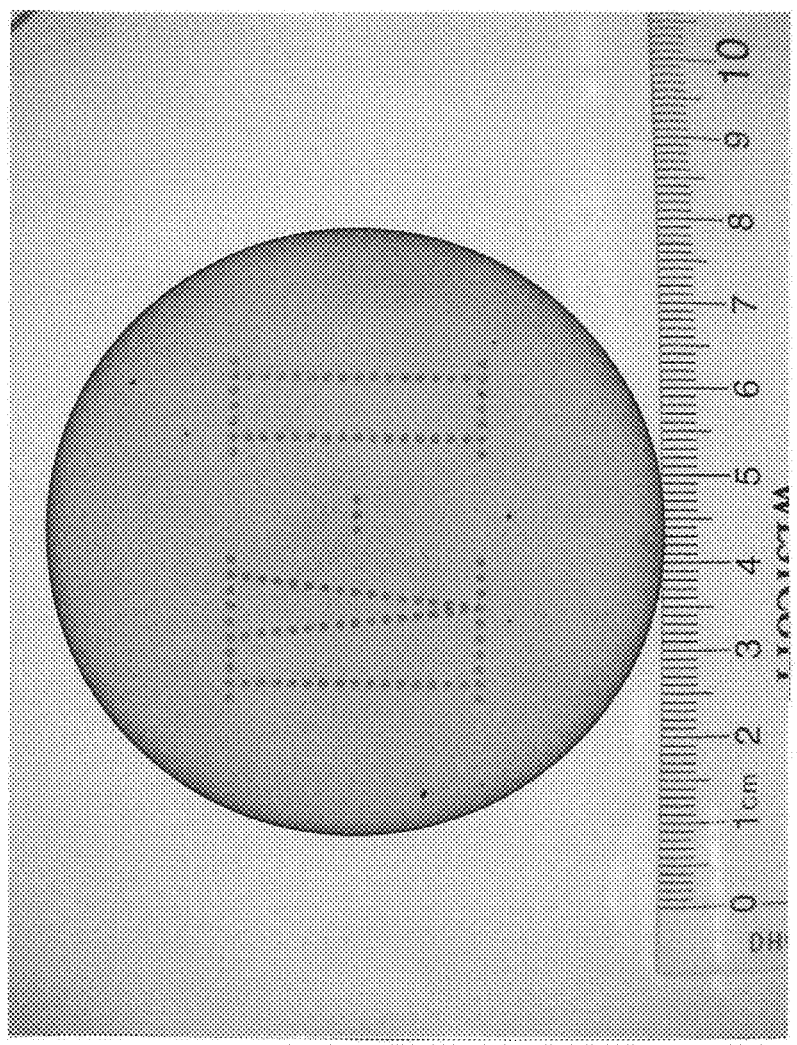
FIG. 3A is a photograph of a diamond film, window, or substrate that was grown conformingly onto a sacrificial substrate that includes a pattern "II-VI" formed in the growth surface of the sacrificial substrate.
Figure 3B:
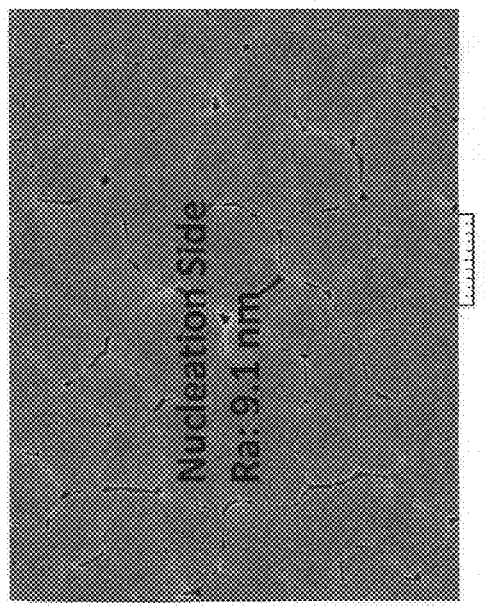
FIGS. 3B and 3C are close-up views of the nucleation side and growth side of the diamond film, window, or substrate shown in FIG. 3A.
Figure 3C:

With reference to FIG. 3A-3C and with continuing reference to FIG. 2, in an example, a piece of single crystal silicon 66 mm in diameter and 11.5 mm in thickness was fabricated using a typical silicon fabrication process and used as silicon substrate 24. Surface 1 of substrate 24 was diamond-turned to an optical-finish surface with a Ra of 6 to 7 nm. A logo "II-VI" was also machined recessively by diamond-turning a "II-VI" pattern of trenches into Surface 1 of silicon substrate 24. Then, silicon substrate 24 was placed in CVD reactor 16, with the diamond-turned optically-finished surface (Surface 1) facing toward quartz window 18. A mixture of reactive gases 6 comprising hydrogen and methane, e.g., 1,850 mL/min hydrogen and 13.6 mL/min methane, was flowed into microwave plasma CVD reactor 16 under the control of mass flow controller 8. After plasma 20 ignition, magnetron 14 power and reactor 16 pressure were tuned so that the plasma 20 size covered Surface 1 of silicon substrate 24. The diamond growth temperature at the center of silicon substrate 24 was controlled, e.g., via an optical pyrometer 26, to 800° C. After 168 hours of diamond growth the growth reaction was stopped a polycrystalline diamond film 4 of 285 microns in thickness was conformingly deposited on Surface 1 of silicon substrate 24. Silicon substrate Was then stripped off of diamond film 4 with a KOH solution at elevated temperature, followed by HF—HNO$_3$ stripping, resulting in free-standing diamond film 4 with a diameter of 66 mm, a thickness of 285 microns, and an aspect ratio of 231. The nucleation surface of free-standing diamond film 4 that grew on Surface 1 of silicon substrate 24 was measured to have a surface roughness (Ra) of 9.1 nm, considered to be an optical finish.

FIG. 3A is an image of the nucleation surface or side of the free-standing diamond film 4 that is optically clear. As can be seen in FIG. 3A, a II-VI logo that grew conformingly into the diamond-turned trenches of Surface 1 of substrate 24, demonstrating that a non-planar surface of a piece of diamond, e.g., diamond film 4, can be attained by growing diamond conformingly into the "Negative" surface of a sacrificial substrate (such as silicon) that can be readily fabricated by one or more conventional fabrication processes. Importantly, the non-planar (nucleation) surface of diamond film 4 shown in FIG. 3A has an optical-finish. FIGS. 3B and 3C are micrographs of the nucleation side (Ra=9.1 nm) and growth side of diamond film 4 shown in FIG. 3A.

In another example, a second piece of single crystal silicon of 66 mm in diameter and 11.5 mm in thickness was fabricated using a typical silicon fabrication process and used as silicon substrate 24. Surface 1 of this silicon substrate 24 was diamond-turned into an optical-finish surface with a Ra of 6 to 7 nm. Then, this entire silicon substrate 24, including Surface 1, was ultrasonic-treated with a diamond-ethanol suspension slurry. This silicon substrate 24 was then placed into CVD reactor 16, with the diamond-turned optically-finished surface (Surface 1) facing quartz window 18. A mixture of reactive gases 6, comprising hydrogen and methane, e.g., 1,850 mL/min hydrogen and 13.6 mL/min methane, was flowed into microwave plasma CVD reactor 16 under the control of mass flow controller 8. After plasma 20 ignition, the magnetron 14 power and the reactor 16 pressure were tuned so that the plasma 20 size covered Surface 1 of the silicon substrate 24. The diamond growth temperature at the center of silicon substrate 24 was controlled, e.g., via an optical pyrometer 26, to 800° C. After 148 hours of diamond growth (the diamond growth reaction was stopped) a polycrystalline diamond film 4 of 233 microns in thickness was conformingly deposited on the surface of silicon substrate 24 facing quartz window 18. Silicon substrate 24 was then stripped off of diamond film 4 with a KOH solution at elevated temperatures, followed by HF—HNO$_3$ stripping, attaining free-standing diamond film 4 with a diameter of 66 mm, a thickness of 233 microns and, an aspect ratio of 283. The nucleation surface of this free-standing diamond film 4 which grew on Surface 1 of silicon substrate 24 was measured to have a surface roughness (Ra) of about 11.5 nm, considered to be an optical finish.

Figure 4:
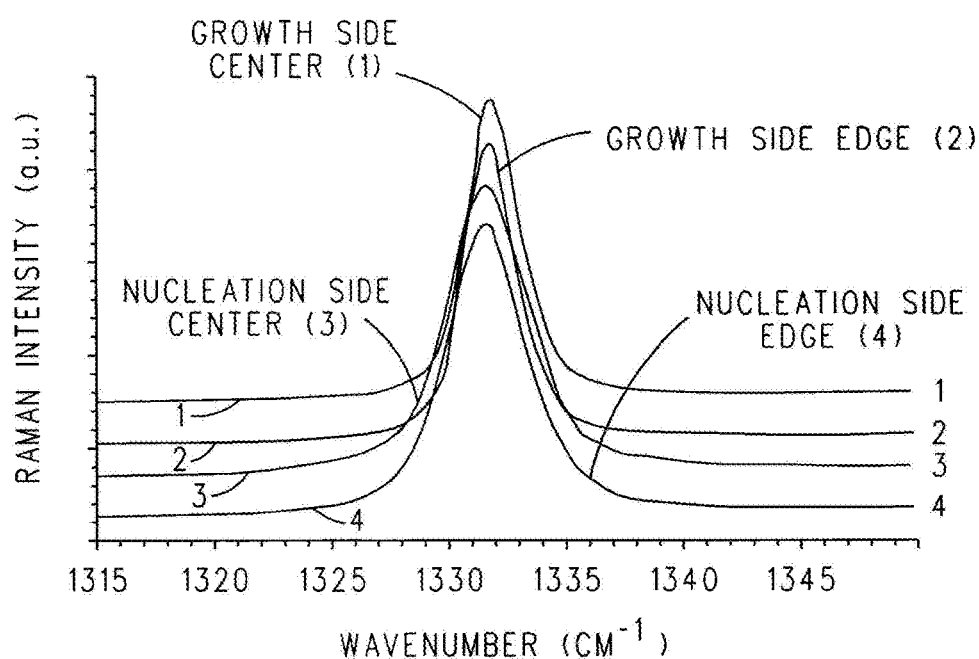
FIG. 4 is a graph of Raman intensity versus wavelength showing Raman graphs of the growth side center, growth side edge, nucleation side center, and nucleation side edge of the diamond film, window, or substrate shown in FIG. 3A.

The quality of this latter example diamond film 4 was studied via Raman spectroscopy, as shown in FIG. 4, which shows that the diamond crystals on the growth side are of excellent quality, as evidenced by a narrow FWHM of about 2.8 cm$^{-1}$ (as compared to the FWHM of 3.5 cm$^{-1}$ for a reference piece of single crystal diamond), with the Raman peak centered between 1331.9 and 1332.1 cm$^{-1}$, suggesting no presence of stress in diamond film 4 on the growth side. The diamond crystals on the nucleation side are also of good quality, evidenced by a FWHM of about 3.8 to 4.1 cm$^{-1}$, with the Raman peak centered at 1331.6 cm$^{-1}$, indicating low stress in diamond film 4 on the nucleation side.

Example 2: Producing Diamond Films with One or Two Surfaces Having an Optical Finish In another example, a piece of single crystal silicon 2 inches (50.8 mm) inches in diameter and 10 mm in thickness was fabricated using a typical silicon fabrication process and used as silicon substrate 24. Both surfaces of this silicon substrate 24 were optically finished via a typical chemical-mechanical polishing process to an Ra of less than 1 nm. Then, this entire silicon substrate 24 was ultrasonically-treated with a diamond (0.25 microns)-ethanol suspension slurry. This silicon substrate 24 was then placed in a CVD reactor 16, with one of the optically-finished surfaces facing quartz window 18. A mixture of reactive gases 6, e.g., 1,850 mL/min hydrogen and 13.6 mL/min methane, was flowed into the microwave plasma CVD reactor 16. After plasma 20 ignition, magnetron 14 power and reactor pressure 16 were tuned so that the plasma 20 size covered the surface of silicon substrate 24 facing quartz window 18. The diamond growth temperature at the center of silicon substrate 24 was controlled, e.g., via optical pyrometer 26, to 800° C. After 140 hours of diamond growth the growth reaction was stopped resulting in a polycrystalline diamond film 4 of 200 to 220 microns in thickness conformingly deposited on the surface of silicon substrate 24 facing quartz window 18. The growth surface of diamond film 24, while diamond film 24 was still on silicon substrate 24, was then lapped and polished to a surface roughness of Ra 5.0 nm. After lapping and polishing, the thickness of diamond film 4 on silicon substrate 24 was about 125 microns. Silicon substrate 24 was then stripped off of diamond film 4 with a KOH solution at elevated temperatures, followed by HF—HNO$_3$ stripping, resulting in free-standing diamond film 4 with a diameter of 2 inches (50.8 mm), a thickness of 125 microns and, an aspect ratio of 406. Both surfaces of free-standing diamond film 24 were of optical finish quality, applicable for uses as an optical window or a substrate for other applications.

In another example, a second piece of single crystal silicon of 2 inches (50.8 mm) in diameter and 10 mm in thickness was fabricated in a typical silicon fabrication process and used as silicon substrate 24. Both surfaces of this silicon substrate 24 were optically finished via typical chemical-mechanical polishing process to an Ra of less than 1 nm. Then, this entire silicon substrate 24 was ultrasonically-treated with diamond-methanol suspension slurry. This silicon substrate 24 was then placed in CVD reactor 16 (FIG. 2), with one of the optically-finished surfaces facing quartz window 18. A mixture of reactive gases 6, e.g., 2,700 mL/min hydrogen and 16.2 mL/min methane, was flowed into the microwave plasma CVD reactor 16 under the control of mass flow controller 8. After plasma 20 ignition, magnetron 14 power and reactor 16 pressure were tuned so that the plasma 20 size covered the surface of silicon substrate 24 facing quartz window 18. The diamond growth temperature at the center of silicon substrate 24 was controlled, e.g., via optical pyrometer 26, to between 832° C. and 866° C. After 72 hours of diamond growth the growth reaction was stopped resulting in a polycrystalline diamond film 4 of 110 to 130 microns in thickness conformingly deposited on the surface of silicon substrate 24 facing quartz window 18. The growth surface of diamond film 4, while diamond film 4 was still on silicon substrate 24, was then lapped and polished to a surface roughness (Ra) of 5.8 nm. After lapping and polishing, the thickness of diamond film 4 on silicon substrate 24 was 60 to 70 microns. Silicon substrate 24 was then stripped off of diamond film 4 with a KOH solution at elevated temperature, followed by HF—HNO$_3$ stripping, resulting in free-standing diamond film 4 with a diameter of 2 inches (50.8 mm), a thickness of 60-70 microns, and an aspect ratio of 781. Both surfaces of free-standing diamond film 4 were of optical finish quality, applicable for uses as an optical window or a substrate other applications.

In yet another example, a third piece of single crystal silicon 2 inches (50.8 mm) in diameter and 10 mm in thickness was fabricated using a typical silicon fabrication process and used as silicon substrate 24. Both surfaces of this silicon substrate 24 were optically finished via a typical chemical-mechanical polishing process to an Ra of less than 1 nm. Then, this entire silicon substrate 24 was rubbed with a 0.25 micron diamond slurry, followed by typical cleaning. This silicon substrate 24 was then placed in a CVD reactor 16 (FIG. 2), with one diamond-slurry-rubbed optically-finished surface facing quartz window 18. A mixture of reactive gases 6, e.g., 2,700 mL/min hydrogen and 16.2 mL/min methane, was flowed into the microwave plasma CVD reactor 16 under the control of mass flow controller 8. After plasma 20 ignition, magnetron 14 power and reactor 16 pressure were tuned so that the plasma 20 size covered the surface of silicon substrate 24 facing quartz window 18. The diamond growth temperature at the center of silicon substrate 24 was controlled, e.g., via optical pyrometer 26, to between 794 and 835° C. After 95 hours of diamond growth the growth reaction was stopped resulting in a polycrystalline diamond film 4 of 2 inches (50.8 mm) in diameter and 156 microns in thickness conformingly deposited on the surface of silicon substrate 24 facing quartz window 18. The diamond film had an aspect ratio of 326. After stripping of silicon substrate 24 from diamond film 4, the surface roughness of the nucleation side of the diamond film 4 was measured to be 7.7 nm and the surface of the growth side of diamond film 4 was determined to have a roughness typical for an as-grown diamond surface.

Figure 6A:
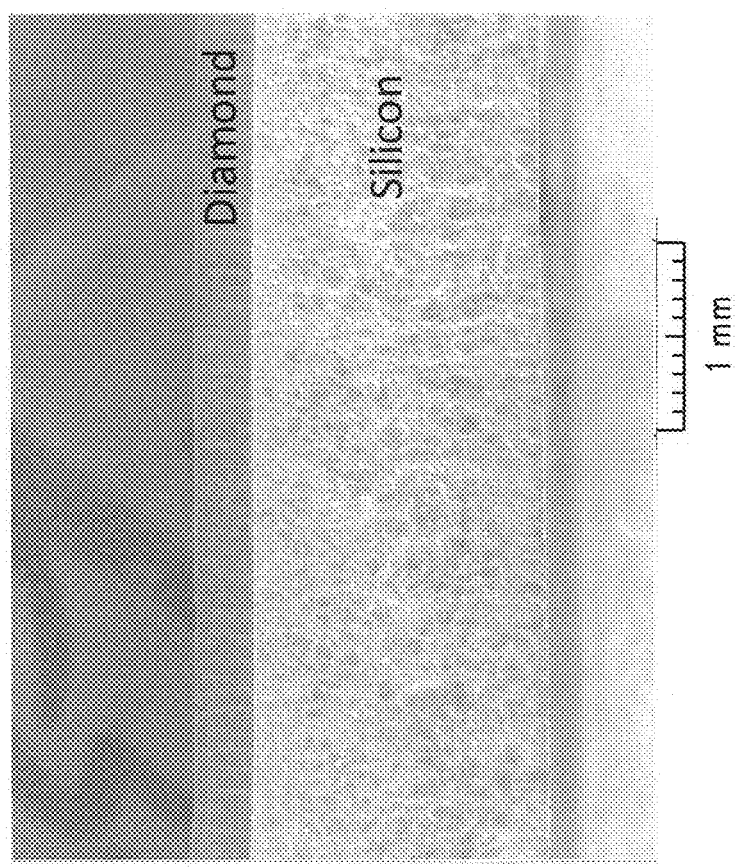
FIGS. 6A-6B are enlarged, cross-sectional views (field-of-views=4.33 mm and 649.6 µm, respectively) of a lapped diamond-on-silicon composite grown in accordance with Example 3 described herein.
Figure 6B:
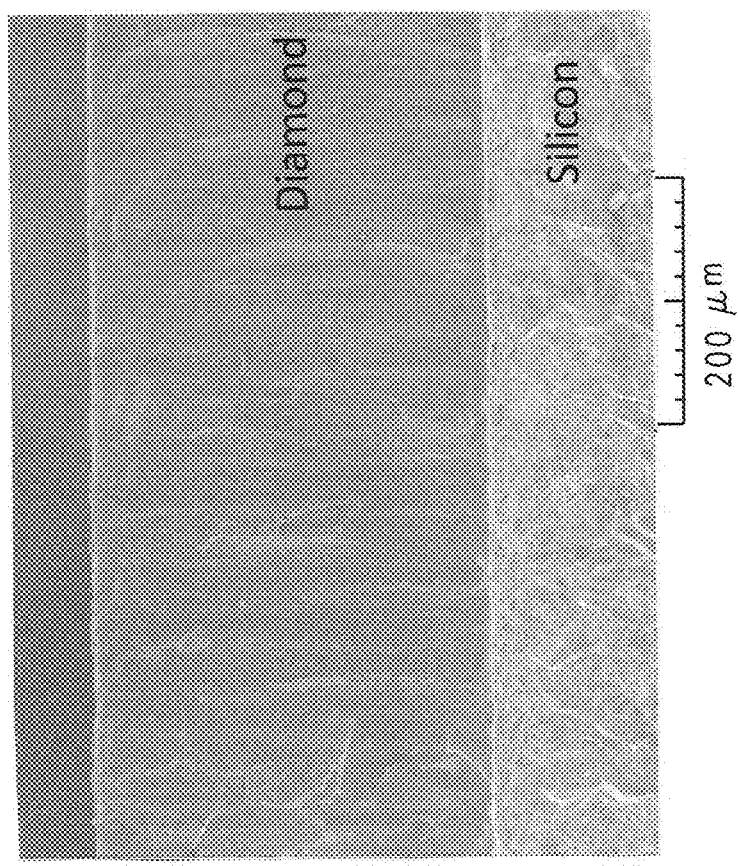

Example 3: Diamond Film(s) Grown on a Single Crystal Si Substrate (166 mm Diameter×10 mm Thickness) with Both Surfaces Chemically-Etched—Producing a Diamond Film with One Surface Having an Optical Finish In another example, a piece of single crystal silicon 166 mm in diameter and 10 mm in thickness was fabricated using a typical silicon fabrication process and used as silicon substrate 24. Both surfaces of this silicon substrate 24 were finished via typical chemical-etching process to a surface roughness (Ra) of 918 nm. Then, this entire silicon substrate 24 was rubbed with diamond powders and placed in CVD reactor 16 (FIG. 2). A mixture of reactive gases 6, e.g., 2,800 mL/min hydrogen and 84 mL/min methane, was flowed into microwave plasma CVD reactor 16 under the control of mass flow controller 8. After plasma 20 ignition, magnetron 14 power and reactor 16 pressure were tuned so that the plasma 20 size covered the surface of silicon substrate 24 facing quality window 18. The diamond growth temperature at the center of silicon substrate 24 was controlled, e.g., via optical pyrometer 26, to 1120° C. After 44 hours of diamond growth the growth reaction was stopped resulting in a polycrystalline diamond film 4 of 350 microns in thickness conformingly deposited on the surface of silicon substrate 24 facing quartz window 18 thereby forming a diamond-on-silicon composite. The diamond 4 growth surface, while the diamond film 4 was still on the silicon substrate 24, was then lapped flat. After lapping, the diamond film 4 thickness was 300 microns. Then, this diamond-on-silicon composite was lapped again on the silicon surface down to a combined thickness about 1.7-1.8 mm. FIGS. 6A and 6B show close-up, cross-sectional views (field-of-views=4.33 mm and 649.6 µm, respectively) of the lapped diamond-on-silicon composite of this example.

The lapped diamond film 4 surface was then further polished to an optical finish, producing a thin diamond film 4 (i.e., thinner than 300 micron in thickness) on silicon substrate 24 of 166 mm in diameter, which can be used as an optical mirror, or as a substrate for electronics, photonics, or optoelectronics.

Next, a piece 50 mm in diameter and several pieces 1 inch (25.4 mm) in diameter were laser-cut from the diamond-on-silicon composite for polishing the exposed diamond growth surface. The exposed diamond growth surface of the 50 mm diameter diamond-on-silicon composite piece was polished to an Ra of 1 nm, and the finished diamond thickness was 170-180 microns. The silicon substrate was then stripped off of the 50 mm diameter piece with a KOH solution at elevated temperature, followed by HF—$HNO_3$ stripping, resulting in a piece of free-standing diamond film 50 mm in diameter, a thickness of 133 microns in the center, a thickness between 144-176 microns around the edge, and a center aspect ratio of 376. The optically-finished growth surface of the free-standing diamond film 50 mm in diameter is applicable for uses as an optical mirror or a substrate for other applications such as thermal management. The nucleation side of the diamond film 50 mm in diameter had a surface roughness (Ra) of about 799 nm, which is similar to the surface roughness of the chemically-etched silicon surface (about 918 nm). Alternatively to removing the silicon substrate from the 50 mm piece of diamond-on-silicon composite, the silicon substrate can be thinned and polished so that a 50 mm piece of diamond-silicon composite with at least the diamond surface that is finished optically is obtained.

Example 4: Diamond Film Grown on a Polycrystalline Si Substrate (166 mm Diameter×10 mm Thickness) with Both Surfaces Chemically-Etched—Producing a Diamond Film with One Surface Having an Optical Finish In another example, a piece of polycrystalline silicon 166 mm in diameter and 10 mm in thickness was fabricated using a typical silicon fabrication process and used as silicon substrate 24. Both surfaces of this silicon substrate 24 were finished via typical chemical-etching process to a surface roughness (Ra) of 816 nm. Then, this entire silicon substrate 24 was rubbed with diamond powders and placed in CVD reactor 16 (FIG. 2). A mixture of reactive gases 6, e.g., 2,800 mL/min hydrogen and 84 mL/min methane, was flowed into microwave plasma CVD reactor 16 under the control of mass flow controller 8. After plasma 20 ignition, magnetron 14 power and reactor 16 pressure were tuned so that the plasma 20 size covered the surface of silicon substrate 24 facing quality window 18. The diamond growth temperature at the center of silicon substrate 24 was controlled, e.g., via optical pyrometer 26, to 1120° C. After 24 hours of diamond growth the growth reaction was stopped resulting in a polycrystalline diamond film 4 of 175 microns in thickness conformingly deposited on the surface of silicon substrate 24 facing quartz window 18. The diamond 4 growth surface, while diamond film 4 was still on silicon substrate 24, was then lapped flat and then polished to an optical finish. The silicon substrate 24 was then stripped off of diamond film 4 with a KOH solution at elevated temperature, followed by HF—$HNO_3$ stripping, resulting in a piece of free-standing diamond film 4 with a diameter of 166 mm, a thickness of less than 175 microns, and an aspect ratio of 948. The diamond growth surface that was optically-finished, can be used as an optical mirror or a substrate for other applications such as thermal management. Alternatively to removing silicon substrate 24, the silicon substrate 24 can be thinned and polished so that a diamond-silicon composite substrate with at least the diamond growth surface finished to an optical finish is obtained, which can be useful as an optical mirror, or a substrate for electronics, photonics, or optoelectronics.

Example 5: Diamond Film(s) Grown on a Polycrystalline Si Substrate (166 mm Diameter×10 mm Thickness) with One Surface Optically-Finished (e.g., Ra 1.3 nm) by Chemical Mechanical Polishing—Producing a Diamond Film with One or Both Surfaces Having an Optical Finish In another example, a piece of polycrystalline silicon 166 mm in diameter and 10 mm in thickness was fabricated using a typical silicon fabrication process and used as silicon substrate 24. Both surfaces of this silicon substrate 24 were finished via a typical chemical-etching process to a surface roughness (Ra) of 816 nm. Then, a Surface 1 of silicon substrate 24 was polished to an optical finish (Ra about 1.3 nm) via a chemical mechanical polishing process. This entire silicon substrate 24 was then treated ultrasonically with an aqueous diamond slurry and placed in a CVD reactor 16 (FIG. 2) for diamond growth with the optically-finished surface (Surface 1) facing quartz window 18. A mixture of reactive gases 6, e.g., 2,800 mL/min hydrogen and 16.8 mL/min methane, was flowed into microwave plasma CVD reactor 16 under the control of mass flow controller 8. After plasma ignition 20, magnetron 14 power and reactor 16 pressure were tuned so that the plasma 20 size covered the Surface 1 of silicon substrate 24. The diamond growth temperature at the center of silicon substrate 24 was controlled, e.g., via optical pyrometer 26, to between 846 and 868° C. After 164 hours of diamond growth the growth reaction was stopped resulting in a polycrystalline diamond film 4 of 166 mm in diameter and 295 microns in thickness conformingly deposited on Surface 1 of silicon substrate 24 thereby forming a diamond-silicon composite. The diamond growth surface, while diamond film 4 was still on silicon substrate 24, was then lapped flat. The lapped diamond growth surface was further polished to an optical finish, which resulted in diamond film 4 having an aspect ratio of 563. In this example, the silicon substrate 24 side of this diamond-silicon composite was ground until the diamond-silicon composite had a total thickness of 1.7-2.0 mm. The diamond-silicon composite was then laser-cut to one piece 75 mm in diameter, two pieces of 38.5 mm in diameter, and two pieces of 1 inch (25.4 mm) in diameter, followed by optical polishing of the exposed diamond growth surface of each piece to obtain for each piece an optically-finished surface with a diamond thickness of ≤150-200 microns. In an example, the surface roughness (Ra) of the polished diamond growth surface of the 75 mm piece was measured to be 2.75 nm (an average of 3.59, 2.35, 2.43, 2.57, and 2.89 nm). The silicon substrate of each piece was then stripped off with a KOH solution at elevated temperature, followed by HF—HNO$_3$ stripping, resulting in free-standing diamond films 4 of 1" (25.4 mm), 38.5 mm, and 75 mm in diameter. Each free-standing diamond film 4 has a thickness of 150 microns and an aspect ratio of 169, 256, and 500, respectively. The optically-finished diamond growth surface of each piece can be used, for example, as an optical window, or as an optical mirror, or as a substrate for other applications such as thermal management.

The piece of the lapped diamond-silicon composite remaining after laser-cutting was treated with a KOH solution at elevated temperature to strip off the silicon substrate to form a piece of free-standing diamond film 4. The nucleation surface of this piece of free-standing diamond film 4 had a mirror-surface finish with a surface roughness (Ra) of 15.3 nm and an average grain size about 20 microns. With fine-tuning the nucleation density, it is believed that the surface roughness of the nucleation surface can be reduced to below 10 nm. Alternatively to removing silicon substrate 24, the silicon substrate 24 (while diamond layer 4 is still on) can be thinned and polished to form a piece of diamond-silicon composite with at least an optically finished diamond surface, which can be used, for example, an optical mirror, or as a substrate for electronics, photonics, optoelectronics, etc.

Example 6: Diamond Growth on a Polycrystalline Si Substrate (166 mm Diameter×10 mm Thickness) with One Surface Having an Optical Finish (Ra<1 nm) by Chemical Mechanical Polishing Process—Producing Diamond Thin Film with One or Both Surfaces Having an Optical Finish In another example, a piece of polycrystalline silicon 166 mm in diameter and 10 mm in thickness was fabricated using a typical silicon fabrication process and used as silicon substrate 24. Both surfaces of this silicon substrate 24 where finished via a typical chemical-etching process. A Surface 1 of this silicon substrate 24 was chemically-mechanically polished to a mirror finish with roughness Ra<1 nm. To realize high diamond nucleation density on Surface 1 of silicon substrate 24, good diamond-to-silicon adhesion, and to avoid a diamond film grown on Surface 1 from delaminating from Surface 1, a two-step seeding process was employed.

First, the entire silicon substrate 24 was treated ultrasonically in a ultrasonic bath comprised of 0.25 µm average size diamond powder/methanol suspension solution and then placed in a CVD reactor 16 (FIG. 2) with Surface 1 facing quartz window 18 for a first diamond nucleation growth step on Surface 1 for one hour using the same growth conditions described for the second diamond nucleation growth step described hereafter in connection with this Example 6. This first diamond nucleation step resulted in low density diamond nucleation (<10$^5$/cm$^2$) on Surface 1 of silicon substrate 24. This silicon substrate 24 including the first step diamond nucleation was then removed from CVD reactor 16 and ultrasonically treated in a nano-crystal diamond powder (typical particle size <20 nm)/methanol suspension solution in a ultrasonic bath.

Post ultrasonic treatment in the nano-crystal diamond powder/methanol suspension solution, this silicon substrate 24 including first step diamond nucleation was re-loaded into CVD reactor 16 with Surface 1 facing quartz window 18 for the second diamond nucleation growth step and consecutive diamond growth on the first step diamond nucleation. In this second step, a mixture of 2,800 mL/min hydrogen and 16.8 mL/min methane was flowed into the CVD reactor 16 under the control of mass flow controller 8. After plasma 20 ignition, magnetron 14 power and reactor 16 pressure were tuned so that the plasma 20 size covered Surface 1 of silicon substrate 24, especially the first step diamond nucleation on Surface 1 of silicon substrate 24. The diamond growth temperature at the center of substrate was controlled, e.g., via optical pyrometer 26, to 800° C.

After 140 hours of diamond growth (during the second step diamond nucleation), the diamond growth reaction was stopped resulting in a silicon-diamond composite having a polycrystalline diamond film 4 thickness of 280 µm conformingly deposited on Surface 1 of silicon substrate 24—an aspect ratio of 593. The diamond growth surface diamond film 4, while diamond film 4 was still on silicon substrate 24, was polished to 210 µm in thickness with a surface roughness of (Ra)=3.28, 6.75, 15.4, 11.4, 12.2, and 6.97 nm measured at different locations of the polished diamond growth surface of diamond film 4, and an aspect ratio of 790.

Figure 7:
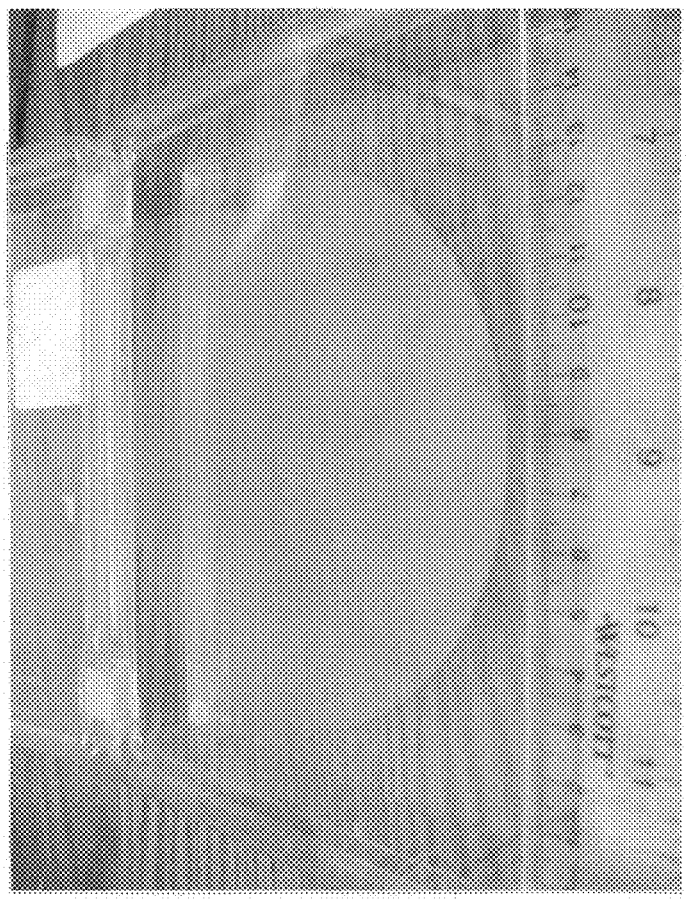
FIG. 7 is a photo a free-standing diamond film 4, grown in accordance with Example 6 described herein, disposed in a tray.

After laser cutting of the silicon-diamond composite into a five inch (12.7 mm) diameter piece, silicon substrate 24 was stripped off of this piece with a KOH solution at elevated temperature, resulting in free-standing diamond film 4 having a diameter of five inches (127 mm), a thickness of 210 µm, and an aspect ratio of 605. A photo of this free-standing diamond film 4 disposed in a tray is shown in FIG. 7.

Figure 8:
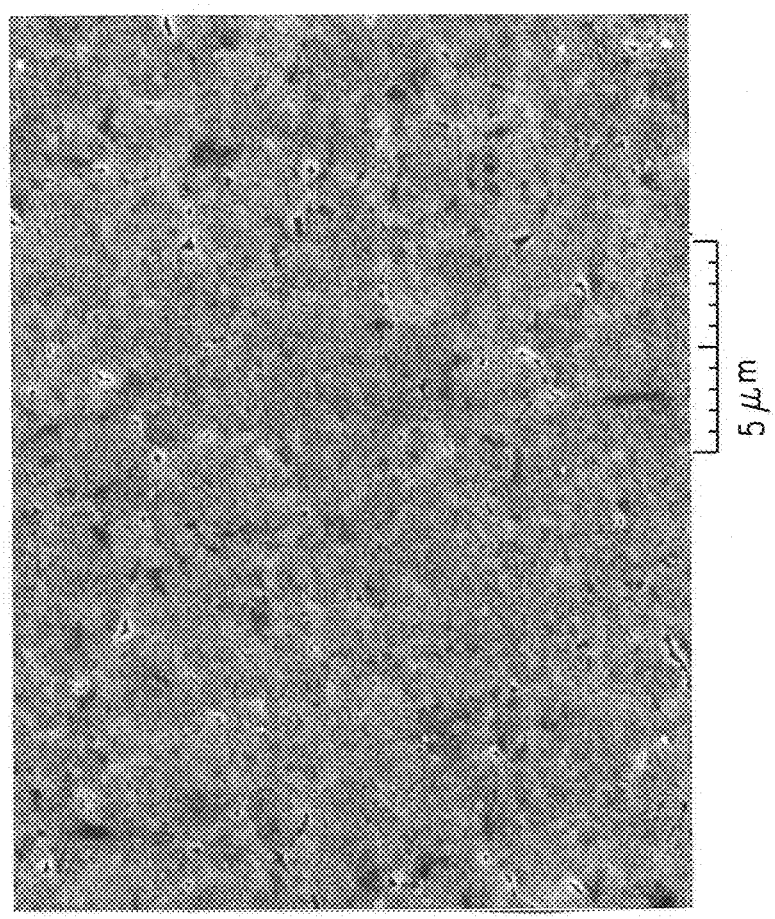
FIG. 8 is an SEM view of the nucleation side/surface of the free-standing diamond film 4 shown in FIG. 7.

The surface roughness of the nucleation side of free-standing diamond film 4 was measured to have an average surface roughness (Ra)=2.08, 2.46, 2.38, 2.07, 1.98, and 1.90 nm measured at different locations of the nucleation surface diamond film 4. The diamond nucleation density of the nucleation side/surface of diamond film 4 was estimated, via SEM observation (FIG. 8), to be >10$^9$/cm$^2$ after the second nucleation step.

This free-standing diamond film 4 having a growth surface and a nucleation surface both optically-finished, can be used as an optical window, mirror, or a substrate for applications such as optical, thermal management, acoustic management, detector, microwave/electromagnetic wave management, mechanical, chemical inertness, friction control, etc.

Alternatively, silicon substrate 24 (while diamond film 4 is still attached) can be thinned and polished so that the piece of diamond-silicon composite with at least the diamond growth surface optically finished is obtained, which can be used as an optical mirror, or as a substrate for electronics, photonics, optoelectronics, etc.

Example 7: Failures in Achieving Good Adhesion of Diamond Film that was Grown on Optically Finished Silicon Substrate (166 mm Diameter×10 mm Thickness) with Nano-Diamond Seeding In another example, a piece of polycrystalline silicon 166 mm in diameter and 10 mm in thickness was fabricated using a typical silicon fabrication process and used as silicon substrate 24. Both surfaces of silicon substrate 24 where finished via a typical chemical-etching process. Surface 1 of this silicon substrate 24 was chemically-mechanically polished to a mirror finish with roughness Ra<1 nm. The entire silicon substrate 24 was then ultrasonically treated (seeded) in a nano-crystal diamond powder (typical particle size <20 nm)/methanol suspension solution in a ultrasonic bath.

Post ultrasonic treatment in the nano-crystal diamond powder/methanol suspension solution, this silicon substrate 24 was loaded into CVD reactor 16 with Surface 1 facing quartz window 18. A mixture of 2,800 mL/min hydrogen and 16.8 mL/min methane was then flowed into the CVD reactor 16 under the control of mass flow controller 8. After plasma 20 ignition, magnetron 14 power and reactor 16 pressure were tuned so that the plasma 20 size covered Surface 1 of silicon substrate 24. The diamond growth temperature at the center of substrate was controlled, e.g., via optical pyrometer 26, to between 821 and 840° C.

After 189 hours of diamond growth, the diamond growth reaction was stopped resulting in a silicon-diamond composite with a polycrystalline diamond film 4 thickness of 320 µm conformingly deposited on Surface 1 of silicon substrate 24. However, this diamond film 4 suffered partial (but substantially) delamination from silicon substrate 24, which did not allow subsequent polishing of the growth surface of diamond film 4 to be performed, resulting in a failure in attaining an optically finished growth surface, though the nucleation surface of the delaminated diamond film 4 was determined to have an average surface roughness (Ra) between 2 and 4 nm.

Example 8: Diamond Growth on an Optically Finished Polycrystalline Silicon Substrate (166 mm Diameter×10 mm Thickness) by 0.25 mm Diamond Particle Seeding In another example, a piece of polycrystalline silicon 166 mm in diameter and 10 mm in thickness was fabricated using a typical silicon fabrication process and used as silicon substrate 24. Both surfaces of silicon substrate 24 where finished via a typical chemical-etching process. Surface 1 of this silicon substrate 24 was chemically-mechanically polished to a mirror finish with roughness Ra<1.5 nm. The entire silicon substrate 24 was then treated (seeded) ultrasonically in a ultrasonic bath in a 0.25 µm average size diamond powder/methanol suspension solution and then placed in a CVD reactor 16 (FIG. 2) with Surface 1 facing quartz window 18.

A mixture of 2,800 mL/min hydrogen and 16.8 mL/min methane was then flowed into CVD reactor 16 under the control of mass flow controller 8. After plasma 20 ignition, magnetron 14 power and reactor 16 pressure were tuned so that the plasma 20 size covered Surface 1 of silicon substrate 24. The diamond growth temperature at the center of substrate was controlled, e.g., via optical pyrometer 26, to between 845 and 868° C.

After 163 hours of diamond growth, the diamond growth reaction was stopped resulting in a silicon-diamond composite with a polycrystalline diamond film 4 thickness of 295 µm conformingly deposited on Surface 1 of silicon substrate 24—an aspect ratio of 563.

While diamond film was adhered to the silicon substrate, the growth surface of diamond film 4 was polished to an optically finish (Ra between 3-5 nm) and a thickness (of diamond film 4) of 99 microns—an aspect ratio of 168. While diamond film 4 was still adhered to silicon substrate 24, the silicon-diamond composite was laser-cut to a number of different pieces having different diameters, followed by removal of the silicon substrate 24 (dissolved by KOH solution) of each piece thereby forming pieces of free-standing diamond film 4. The nucleation surfaces of these pieces of free-standing diamond film 4 had an average surface roughness (Ra) between 5 and 9 nm, and a nucleation density of $\geq 10^5/cm^2$. One of these pieces of free-standing diamond film 4 had a thickness of 99 microns and, as shown in graph (a) of FIG. 9, was characterized for 1.06 µm wavelength light scattering with a light scattering coefficient of 8.22/cm at a distance of 34.0 mm from a scattering light collection lens.

Example 9: Growth Diamond on Optically Finished Silicon Substrate (2 Inch (50.8 mm) Diameter×10 mm in Thickness) by $1^{st}$ Step Seeding (0.25 mm Diamond Particle Seeding) and Followed by $2^{nd}$ Step Seeding (Nano-Diamond Particle Seeding)

In another example, a piece of polycrystalline silicon 50.8 mm diameter×10 mm in thickness was fabricated using a typical silicon fabrication process and used as silicon substrate 24. Both surfaces of silicon substrate 24 where were chemically-mechanically polished to a mirror finish with roughness Ra<1.5 nm. The entire silicon substrate 24 was then ultrasonically treated (seeded) in a 0.25 µm average size diamond powder/methanol suspension solution and then placed in a CVD reactor 16 (FIG. 2).

A mixture of 2,800 mL/min hydrogen and 16.8 mL/min methane was then flowed into CVD reactor 16 under the control of mass flow controller 8. After plasma 20 ignition, magnetron 14 power and reactor 16 pressure were tuned so that the plasma 20 size covered a Surface 1 of silicon substrate 24 that faced quartz window 18. The diamond growth temperature at the center of silicon substrate 24 was controlled, e.g., via optical pyrometer 26, to 780° C. After one hour of diamond growth, the diamond growth reaction was stopped, and diamond-seeded silicon substrate 24 was observed to have diamond particles deposited about Surface 1 of silicon substrate 24.

The diamond-seeded silicon substrate 24 was then removed from CVD reactor 16 and ultrasonically treated in a nano-crystal diamond powder (typical particle size <20 nm)/methanol suspension solution in a ultrasonic bath. The nano-diamond-treated diamond-seeded Si substrate was then reloaded into CVD reactor 16 with Surface 1 again facing quartz window 18. A mixture of 2,800 mL/min hydrogen and 16.8 mL/min methane was then flowed into CVD reactor 16 under the control of mass flow controller 8. After plasma 20 ignition, magnetron 14 power and reactor 16 pressure were tuned so that the plasma 20 size covered Surface 1 of silicon substrate 24. The diamond growth temperature at the center of the silicon substrate 24 was controlled, e.g., via optical pyrometer 26, to between 790 and 821° C.

After an additional 143 hours of diamond growth, the diamond growth reaction was stopped resulting in a silicon-diamond composite with a diamond film 4 thickness of 245 microns—an aspect ratio of 207. The diamond growth surface, while diamond film 4 was still on silicon substrate 24, was polished to an optical finish (Ra between 3-5 nm) and a thickness (of diamond film 4) of 197 microns—an aspect ratio of 258.

Silicon substrate 24 was then removed (dissolved with a KOH solution) from this silicon-diamond composite leaving a free-standing diamond film 4. The nucleation surface of this free-standing diamond film 4 had an average surface roughness (Ra)=2.73 nm, a nucleation density of $\geq 10^9/cm^2$, and a smooth surface finish, the latter two of which are highly desirable for applications such as, for example, thermal management, optical management, semiconductor device, friction control, etc. This free-standing diamond film 4, as shown in graph (b) of FIG. 9, was also characterized for 1.06 μm wavelength light scattering with a light scattering coefficient of 2.69/cm at a distance of 34 mm from the scattering light collection lens. 1.06 μm wavelength light scattering is considered in the art as low micron light scattering and is highly desirable for optical, thermal, acoustic applications, etc.

Example 10: Growth Diamond on Optically Finished Silicon Substrate (2 Inch (50.8 mm) Diameter×10 mm in Thickness) by One Step Seeding (Nano-Diamond Particle Seeding)

In another example, a piece of polycrystalline silicon 50.8 mm diameter×10 mm in thickness was fabricated using a typical silicon fabrication process and used as silicon substrate 24. Surface 1 of this silicon substrate 24 was chemically-mechanically polished to a mirror finish with roughness Ra<1.5 nm, while the other surface was etched via a typical chemical-etching process. Next, this silicon substrate 24 was ultrasonically treated in a nano-crystal diamond powder (typical particle size <20 nm)/methanol suspension solution in a ultrasonic bath.

This silicon substrate was then loaded into CVD reactor 16 with Surface 1 facing quartz window 18. A mixture of 2,800 mL/min hydrogen and 16.8 mL/min methane was then flowed into CVD reactor 16 under the control of mass flow controller 8. After plasma 20 ignition, magnetron 14 power and reactor 16 pressure were tuned so that the plasma 20 size covered a Surface 1 of silicon substrate 24. The diamond growth temperature at the center of silicon substrate 24 was controlled, e.g., via optical pyrometer 26, to 800° C.

After 118 hours of diamond growth, the diamond growth reaction was stopped resulting in a silicon-diamond composite with a diamond film 4 thickness of 190 μm conformingly deposited on Surface 1 of silicon substrate 24. The diamond growth surface, while diamond film 4 was still on silicon substrate 24, was polished to an optical finish and a thickness (of diamond film 4) of 140 microns.

Silicon substrate 24 was then removed (dissolved with a KOH solution) from this silicon-diamond composite leaving a free-standing diamond film 4. The nucleation surface of this free-standing diamond film 4 had an average surface roughness (Ra) between 2 and 3 nm, a nucleation density of $\geq 10^9/cm^2$, and a smooth surface finish, the latter two of which are highly desirable for applications such as, for example, thermal management, optical management, semiconductor device, friction control, etc.

Figure 9:
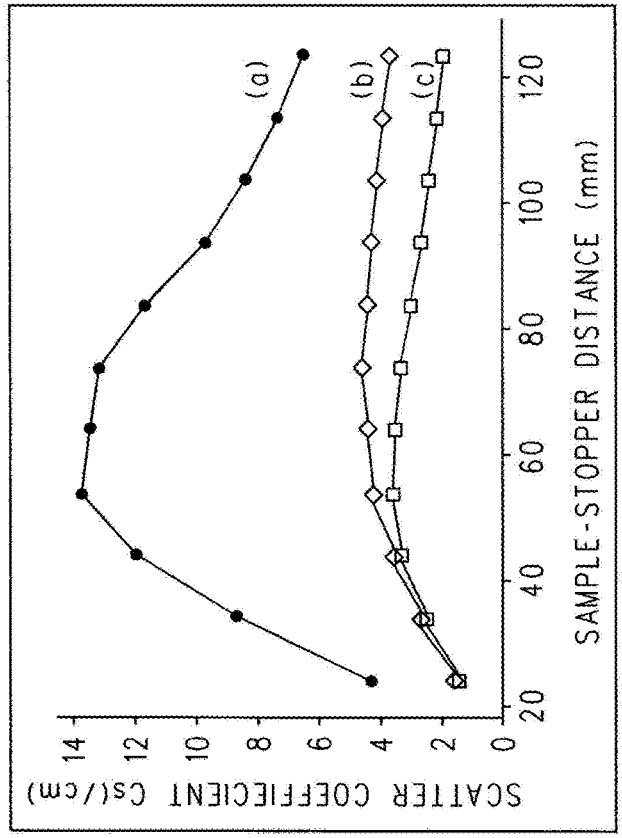
FIG. 9 are three graphs of light scattering coefficients of free-standing diamond films 4 grown in accordance with Examples 8-10, respectively, described herein.

This free-standing diamond film 4 was also characterized, as shown in graph (c) of FIG. 9, for 1.06 μm wavelength light scattering with a light scattering coefficient of 2.09/cm at a distance 34 mm from the scattering light collection lens.

Several additional runs in accordance with the principles of this Example 10 on different silicon substrates 24 under the same diamond growth conditions experienced problems. In one example, diamond film 4 delaminated from silicon substrate 24, which did not allow for further polishing to be performed on the growth surface of the delaminated diamond film. These examples suggest that nano-diamond seeding alone may not be a reliable process for producing thin diamond substrate with at least one optically finished surface.

Comparative Example 1: Failures in Diamond Film Growth on Silicon Wafers (6" (15.24 mm) in Diameter and 625 Microns in Thickness)

In an example, three silicon wafers 24 (n-type, 6" (152.4 mm) in diameter and 625 microns in thickness) were provided. Surface 1 of each silicon wafer 24 was chemically-mechanically polished to an optical surface finish and the other side surface of each silicon wafer 24 was finished with chemical etching. Surface 1 (optically finished) of each silicon wafer 24 was then rubbed with diamond powders.

One of the silicon wafers 24 was then placed inside microwave plasma CVD reactor 16 for diamond growth, with optically-finished Surface 1 facing the quartz window 18. A mixture of reactive gases 6, e.g., 2,500 mL/min hydrogen and 75 mL/min methane, was flowed into microwave plasma CVD reactor 16. After plasma 20 ignition, magnetron 14 power and reactor 16 pressure were tuned for the purpose of having plasma 20 cover Surface 1 of silicon wafer 24. During this plasma tuning process, this silicon wafer 24 shattered into a number of small pieces.

This experiment was repeated with the other two silicon wafers, varying the rate of the power and pressure changes, with the same result, namely, the other two silicon wafers 24 also shattered into a number of small pieces.

Comparative Example 2: Failures in Attaining Optically-Finished Diamond that is Thinner than 400 Microns in Thickness In an example, pieces of CVD grown diamond with diameters of 50 mm, 75 mm, 85 mm, and 100 mm were laser-cut from an as-grown diamond wafer with a thickness greater than 550 microns. Then, the as-grown surface of each diamond piece was lapped flat. Then, one side of each surface, either the growth surface or the nucleation surface, of these diamond pieces were polished to an optical-finish by a conventional polishing technique. When flipping over and attempting to thin and polish the other side, these diamond pieces shattered before approaching 400 microns in thickness, suggesting that an aspect of ratio of 125 is difficult to achieve with conventional diamond polishing processes.

As can be seen, disclosed herein is a diamond film, substrate, or window that comprises either (1) at least one optically-finished surface and an aspect ratio of 100 or greater, or (2) a combination of a thickness of ≤400 and a largest or longest geometric dimension of ≥25 mm.

The optically-finished surface can have a surface roughness (Ra)≤50 nm, ≤30 nm, ≤20 nm, ≤15 nm, or ≤10 nm.

The largest or longest geometric dimension can be ≥40 mm, ≥50 mm, 60 mm, ≥70 mm, ≥80 mm, or ≥100 mm.

The thickness of the diamond, film, substrate, or window can be ≤400 microns, ≤350 microns, ≤300 microns, ≤250 microns, or ≤200 microns.

The aspect ratio, defined as the ratio of the largest or longest geometric dimension of the diamond film, substrate, or window to the thickness of the diamond film, substrate, or window, can be ≥100, ≥125, ≥150, ≥175, or ≥200.

The diamond, film, substrate, or window can have 1.06 micron light scattering coefficient, at a distance of 34 cm from a light blocking lens, of ≤20/cm, or ≤15/cm, or ≤10/cm, or ≤7/cm, or ≤5/cm.

A piece of sacrificial substrate (such as silicon) can be used to grow the diamond film, substrate, or window. The sacrificial substrate can have a thickness ≥2 mm, ≥4 mm, ≥6 mm, or ≥8 mm.

The sacrificial substrate can have an optically-finished surface, i.e., a surface having a surface roughness (Ra)≤20, ≤15 nm, ≤10 nm, ≤5 nm, or ≤2 nm.

After CVD diamond growth on the sacrificial substrate, the sacrificial substrate can be removed, e.g., chemically (by caustic, hydrogen fluoride, or ion etching) and/or mechanically (grinding or lapping). The at least one optically-finished surface of the diamond film, substrate, or window can be the growth surface, the nucleation surface, or both.

The growth surface of the diamond film, substrate, or window can be finished optically via a conventional polishing process while the diamond film, substrate, or window is still attached to the silicon substrate, wherein the total thickness of the diamond film, substrate, or window and the sacrificial substrate is thick enough to allow the conventional polishing process to hold and polish the diamond film, substrate, or window without shattering during polishing. After achieving an optical-level finishing on the growth surface of the diamond film, substrate, or window, the sacrificial substrate can be removed, e.g., chemically and/or mechanically. The result of this process is a thin, e.g., ≤400 micron thick, diamond film, substrate, or window that has at least one surface (e.g., the growth surface) optically finished.

The growth side of a piece of the polycrystalline diamond film, substrate, or window can have a greater thermal conductivity than the nucleation side of the diamond film, substrate, or window. In an example, only the growth side of the diamond film, substrate, or window can be optically finished while the nucleation side of the diamond film, substrate, or window need not be optically finished. Therefore, the diamond growth surface of the sacrificial substrate need not be optically finished. In an example, the diamond growth surface of the sacrificial substrate can be chemically-etched and/or mechanically-lapped, whereupon the nucleation side of the diamond film, substrate, or window grown on this surface of the sacrificial substrate will not have an optical finish.

In an example, the nucleation side of a diamond film, substrate, or window having an optical finish can have a greater thermal conductivity compared to other conventional thermal management materials, such as copper.

In an example, a sacrificial substrate (such as silicon) with at least one optically finished surface for diamond growth can facilitate CVD growth of a diamond film, substrate, or window that is optically finished on the nucleation side. After diamond growth, the growth surface of the diamond film, substrate, or window can optionally be lapped flat and/or polished, followed by the optional removal of the sacrificial substrate, e.g., by chemical etching and/or mechanical lapping/grinding. This process results in the successful production of a piece of diamond film, substrate, or window that has an optically-finished surface (on the nucleation side) without having to use a conventional diamond polishing process, avoiding the risk of shattering or breaking the diamond film, substrate, or window during polishing.

A light management coating, such as, for example, an antireflective coating, a beam splitter coating, a total reflective coating, etc. can be applied to the growth and/or nucleation surface(s) of the diamond film, window, or substrate. The diamond films, substrates, or windows described herein can also be laser-cut into different geometric dimensions for different applications. The laser-cutting can be carried out while the diamond film, substrate, or window is still on the silicon substrate (on which diamond film, substrate, or window is as-grown) and lapped, and/or polished.

The diamond film, substrate, or window can be of optical quality (low absorption of the electromagnetic waves such as infrared light, near infrared light, visible light, or UV light) and can also or alternatively have a low loss tangent at microwave wavelengths. It can also or alternatively be of mechanical and/or thermal grade diamond (the latter of which is typically dark in color).

The diamond film, substrate, or window can be grown via microwave-aided plasma CVD process, hot-filament CVD process, thermal spray CVD process, arc discharge plasma CVD process, direct current thermal plasma CVD process, radio-frequency plasma CVD process, water-based plasma CVD process, acetylene touch plasma CVD process, or high frequency plasma CVD process.

The growth temperature for the growth of the diamond film, substrate, or window can range from 600° C. to 1300° C. The use of higher growth temperatures is envisioned.

The growth rate for the diamond film, substrate, or window can be submicron per hour to 20 microns per hour. Higher growth rates are envisioned.

The methane concentration for growing the diamond substrate film, substrate, or window can range from less than 1% to as high as 5% in hydrogen.

Other additives including, for example, oxygen, carbon monoxide, carbon dioxide, nitrogen, and/or boron, can also be added to the growth environment for the purpose of controlling diamond growth rate and/or the quality of the grown diamond.

One or both surfaces of the sacrificial substrate (such as silicon), can be optionally optically-finished and/or can be optionally diamond seeded, for example, by ultrasonic treatment with aqueous diamond slurries or organic diamond slurries, by rubbing with diamond powers, or by diamond turning.

The sacrificial substrate (such as silicon) for diamond growth can be ≥30 mm in diameter, or ≥2" in diameter, or ≥66 mm in diameter, or ≥3" in diameter, or ≥4" in diameter, or ≥5" in diameter.

The diamond growth surface of the sacrificial substrate (such as silicon) can be optically finished or chemically etched. The surface roughness (Ra) of the optically finished surface of the sacrificial substrate (such as silicon) can be ≤20 nm, ≤15 nm, ≤10 nm, ≤5 nm, or ≤2 nm.

The grown diamond film, substrate, or window can have one or more non-planar surface(s). In one non-limiting example, the nucleation side of the non-planar surface can have the shape of one of the following: dome, cone, pyramid, asphere, parabola, and hyperbola, or any other non-planar geometry that can have an optically-finished surface that can be grown conformingly onto an optically-finished surface contour of a sacrificial substrate (such as silicon) that is optically finished. Such optically-finished surface contour of the sacrificial substrate can be a negative to the desirable surface contour of the final diamond part. After diamond growth, the sacrificial substrate (such as silicon) can be removed, e.g., chemically by etching (such as KOH or HF) and/or mechanically by grinding and lapping. A desirable contour of the non-planar surface of the sacrificial substrate (such as silicon) can be fabricated by a diamond turning process or by a typical optical fabrication process.

The diamond film, substrate, or window can be used as an optical window; a substrate for thermal management for electronics, photonics, and optoelectronics; a substrate for uses in chemical inertness; sound wave management; electromagnetic wave management; friction control; and detector; and as a material for mechanical application such as, for example, milling, cutting, drilling, lacing, etc.

In an example, the diamond-silicon composite substrate includes a layer of diamond CVD grown on a layer of silicon. At least the growth surface of the diamond layer can be optically finished to surface roughness (Ra)≤50 nm, ≤30 nm, ≤20 nm, ≤15 nm, or 10 nm. The total thickness of the composite can be ≥300 microns, ≥500 microns, ≥1 mm, ≥2 mm, or ≥5 mm. The diameter of the diamond-silicon composite substrate can be ≥20 mm, ≥30 mm, ≥40 mm, ≥50 mm, ≥75 mm, ≥100 mm, ≥125 mm, or ≥150 mm.

The diamond film, substrate, or window described in any of the above examples can be used in applications such as, for example, an optical window for light transmittance, an optical mirror for light reflection, an light splitter, an microwave windows, a detector, a substrate for thermal management for electronics, photonics, and/or optoelectronics (such as, but not limited to, a laser diode, a laser diode array like Diode Laser Bar, a vertical-cavity surface emitting laser (VCSEL), an array of vertical-cavity surface emitting laser, a light-emitting device, etc.).

The examples have been described with reference to the accompanying Figs. Modifications and alterations will occur to others upon reading and understanding the foregoing examples. Accordingly, the foregoing examples are not to be construed as limiting the disclosure.

The invention claimed is:

1. A method of forming a planar, free-standing diamond film, diamond substrate, or diamond window comprising:
   (a) CVD growing on a surface of a silicon substrate a diamond film, diamond substrate, or diamond window having an aspect ratio ≥100 and a thickness between 150-999 microns, wherein the aspect ratio is a ratio of a largest dimension of the diamond film, diamond substrate, or diamond window divided by a thickness of the diamond film, diamond substrate, or diamond window; and
   (b) chemically or mechanically removing the silicon substrate from the grown diamond film, diamond substrate, or diamond window.

2. The method of claim 1, wherein the silicon substrate has a thickness ≥2 mm.

3. The method of claim 1, further including, prior to step (a), polishing the surface of the silicon substrate to an optical finish having a surface roughness (Ra)≤20 nm.

4. The method of claim 3, wherein:
   a nucleation side of the as-grown diamond film, diamond substrate, or diamond window has an Ra greater than the Ra of the polished surface of the silicon substrate; and
   for an Ra of the polished the surface of the silicon substrate ≤20 nm, the Ra of the nucleation side of the as-grown diamond film, diamond substrate, or diamond window is ≤50 nm.

5. The method of claim 3, wherein:
   a nucleation side of the as-grown diamond film, diamond substrate, or diamond window has an Ra greater than the Ra of the polished surface of the silicon substrate; and
   for an Ra of the polished the surface of the silicon substrate ≤15 nm, the Ra of the nucleation side of the as-grown diamond film, diamond substrate, or diamond window is ≤30 nm.

6. The method of claim 3, wherein:
   a nucleation side of the as-grown diamond film, diamond substrate, or diamond window has an Ra greater than the Ra of the polished surface of the silicon substrate; and
   for an Ra of the polished the surface of the silicon substrate ≤2 nm, the Ra of the nucleation side of the as-grown diamond film, diamond substrate, or diamond window is ≤10 nm.

7. The method of claim 1, wherein the surface of the silicon substrate and a nucleation side of the as-grown diamond film, diamond substrate, or diamond window each have a surface roughness (Ra)≥750 nm.

8. The method of claim 1, further including, while the diamond film, diamond substrate, or diamond window is still on the silicon substrate, polishing a growth surface of the diamond film, diamond substrate, or diamond window to a surface roughness (Ra)≤50 nm.

9. The method of claim 1, wherein:
   a shape of the nucleation side of the as-grown diamond film, diamond substrate, or diamond window is a conformal negative of the shape of the surface of the silicon substrate.

10. The method of claim 1, wherein a growth side of the as-grown diamond film, diamond substrate, or diamond window has a greater thermal conductivity than the nucleation side of the as-grown diamond film, diamond substrate, or diamond window.

11. The method of claim 1, further including at least one of the following:
   applying a light management coating to a growth surface of the grown diamond film, diamond substrate, or diamond window; and
   after removing the silicon substrate from the grown diamond film, diamond substrate, or diamond window, applying the light management coating to a nucleation side of the grown diamond film, diamond substrate, or diamond window.

12. The method of claim 1, further including cutting the silicon substrate having the diamond film, diamond substrate, or diamond window grown thereon into one or more pieces.

13. The method of claim 1, wherein step (a) includes CVD growing the diamond film, diamond substrate, or diamond window in an atmosphere that includes at least one of the following: oxygen, carbon monoxide, carbon dioxide, nitrogen, and boron.

14. The method of claim 1, wherein, prior to step (a), the surface of the silicon substrate is seeded with diamond particles.

15. The method of claim 14, wherein the silicon substrate is seeded with diamond particles via at least one of the following processes: (1) ultrasonic treatment of the silicon substrate in a ultrasonic bath comprised of a submicron or micron-sized diamond powder in a liquid suspension solution; and (2) ultrasonic treatment of the silicon substrate in a ultrasonic bath comprised of nano-crystal diamond powder having an average particle size <100 nm in a liquid suspension solution.

16. The method of claim 15, wherein the liquid suspension solution comprises one or more of the following: water, alcohol, hydrocarbon, and organic solvent.

17. The method of claim 14, wherein the silicon substrate is seeded with diamond particles via a least one of the following processes: (1) ultrasonic treatment of the silicon substrate in a bath of aqueous diamond slurries or organic diamond slurries, or (2) rubbing the silicon substrate with diamond powders.

18. The method of claim 1, wherein the largest dimension of the silicon substrate is ≥30 mm.

19. The method of claim 18, wherein the largest dimension of the silicon substrate is a diameter of the silicon substrate.

20. The method of claim 1, wherein the silicon substrate has a thickness ≥8 mm.

21. The method of claim 1, further including, prior to step (a), polishing the surface of the silicon substrate to an optical finish having a surface roughness (Ra)≤2 nm.

22. The method of claim 1, further including, while the diamond film, diamond substrate, or diamond window is still on the silicon substrate, polishing a growth surface of the diamond film, diamond substrate, or diamond window to a surface roughness (Ra)≤10 nm.

23. The method of claim 1, wherein the largest dimension of the silicon substrate is ≥50.8 mm.

24. The method of claim 1, wherein the largest dimension of the silicon substrate is ≥127 mm.

25. A method of forming a planar, free-standing diamond film, diamond substrate, or diamond window comprising:
  (a) CVD growing on a surface of a silicon substrate polished to an optical finish having a surface roughness (Ra)≤20 nm a diamond film, diamond substrate, or diamond window having an aspect ratio ≥100 and a thickness between 150-999 microns, wherein the aspect ratio is a ratio of a largest dimension of the diamond film, diamond substrate, or diamond window divided by a thickness of the diamond film, diamond substrate, or diamond window; and
  (b) chemically or mechanically removing the silicon substrate from the grown diamond film, diamond substrate, or diamond window.

26. A method of forming a planar, free-standing diamond film, diamond substrate, or diamond window comprising:
  (a) CVD growing on a surface of a silicon substrate a diamond film, diamond substrate, or diamond window having an aspect ratio ≥100 and a thickness between 150-999 microns, wherein the aspect ratio is a ratio of a largest dimension of the diamond film, diamond substrate, or diamond window divided by a thickness of the diamond film, diamond substrate, or diamond window, wherein the surface is seeded with diamond particles via ultrasonic treatment of the silicon substrate in a ultrasonic bath comprised of (1) submicron or micron-sized diamond powder in a liquid suspension solution; or (2) nano-crystal diamond powder having an average particle size <100 nm in a liquid suspension solution; and
  (b) chemically or mechanically removing the silicon substrate from the grown diamond film, diamond substrate, or diamond window.

* * * * *